United States Patent [19]

Masui

[11] Patent Number: 5,710,904
[45] Date of Patent: Jan. 20, 1998

[54] MICROPROCESSOR HAVING ADDRESS PRE-OUTPUTTING FUNCTION AND DATA PROCESSOR USING THE SAME

[75] Inventor: Norio Masui, Itami, Japan

[73] Assignee: Mitsubishi Denki Kabushiki Kaisha, Tokyo, Japan

[21] Appl. No.: 225,870

[22] Filed: Apr. 11, 1994

[30] Foreign Application Priority Data

Apr. 9, 1993 [JP] Japan ..................... 5-83266

[51] Int. Cl.$^6$ .................................. G06F 12/02
[52] U.S. Cl. ............... 395/405; 395/421.08; 395/421.09
[58] Field of Search .................. 395/405, 421.08, 395/421.07, 421.09

[56] References Cited

U.S. PATENT DOCUMENTS 4,803,621  2/1989  Kelly ........................ 395/405
5,371,877  12/1994  Drako et al. ................ 395/405

FOREIGN PATENT DOCUMENTS 63-129438  6/1988  Japan .
1-128143   5/1989  Japan .
2-153444   6/1990  Japan .

OTHER PUBLICATIONS

M32 Family User's Manual, M33210GS-20/FP-20, Mitsubishi Electric Co., Ltd., Jun. 1989, pp. 14 and 36.

Primary Examiner—Eddie P. Chan
Assistant Examiner—Reginald G. Bragdon
Attorney, Agent, or Firm—Lowe, Price, LeBlanc & Becker

[57] ABSTRACT

A microprocessor accesses a first and second area of an external memory by outputting common addresses excluding a least significant bit of the actual addresses. The first area stores even addresses and the second area stores odd addresses. The microprocessor comprises a microprocessor core generating the actual addresses, an address counter generating a pre-output address value obtained by, at a start of every accessing to the second area, sequentially incrementing from an initial value obtained by excluding the least significant bit from the actual address generated by the microprocessing core, an address latch latching the pre-output address value, a control circuit controlling the address latch to latch the pre-output address value and provide the pre-output address value to the memory after accessing the memory, and an address comparator. The address comparator, at the time of accessing the first and second areas, compares the value obtained by excluding the least significant bit from the actual address generated by the microprocessing core and the pre-output address value latched by the address latch, and outputs a hit signal upon coincidence. The control circuit controls the address counter and the address latch to latch the value obtained by excluding the least significant bit from the actual address when the address comparator does not output a hit signal. Thus, an access time can be shortened at reading a plurality of sequential data successively from the memory whose access time is relatively long.

4 Claims, 19 Drawing Sheets

Fig. 3
Prior Art

| ADD. | STORED CONTENT |
|---|---|
| 1000 | 10th INSTRUCTION (IN10) |
| 1001 | 11th INSTRUCTION (IN11) |
| 1010 | 12th INSTRUCTION (IN12) |
| 1011 | 13th INSTRUCTION (IN13) |
| 1100 | 14th INSTRUCTION (IN14) |
| 1101 | 15th INSTRUCTION (IN15) |
| 100000 | 20th INSTRUCTION (IN20) |
| 100001 | 21st INSTRUCTION (IN21) |
| 100010 | 22nd INSTRUCTION (IN22) |
| 100011 | 23rd INSTRUCTION (IN23) |

Fig. 9A

| ADD. | STORED CONTENT |
|---|---|
| 100 | 10th INSTRUCTION (IN10) |
| 101 | 12th INSTRUCTION (IN12) |
| 110 | 14th INSTRUCTION (IN14) |
| 10000 | 20th INSTRUCTION (IN20) |
| 10001 | 22nd INSTRUCTION (IN22) |

Fig. 9B

| ADD. | STORED CONTENT |
|---|---|
| 100 | 11th INSTRUCTION (IN11) |
| 101 | 13th INSTRUCTION (IN13) |
| 110 | 15th INSTRUCTION (IN15) |
| 10000 | 21st INSTRUCTION (IN21) |
| 10001 | 23rd INSTRUCTION (IN23) |

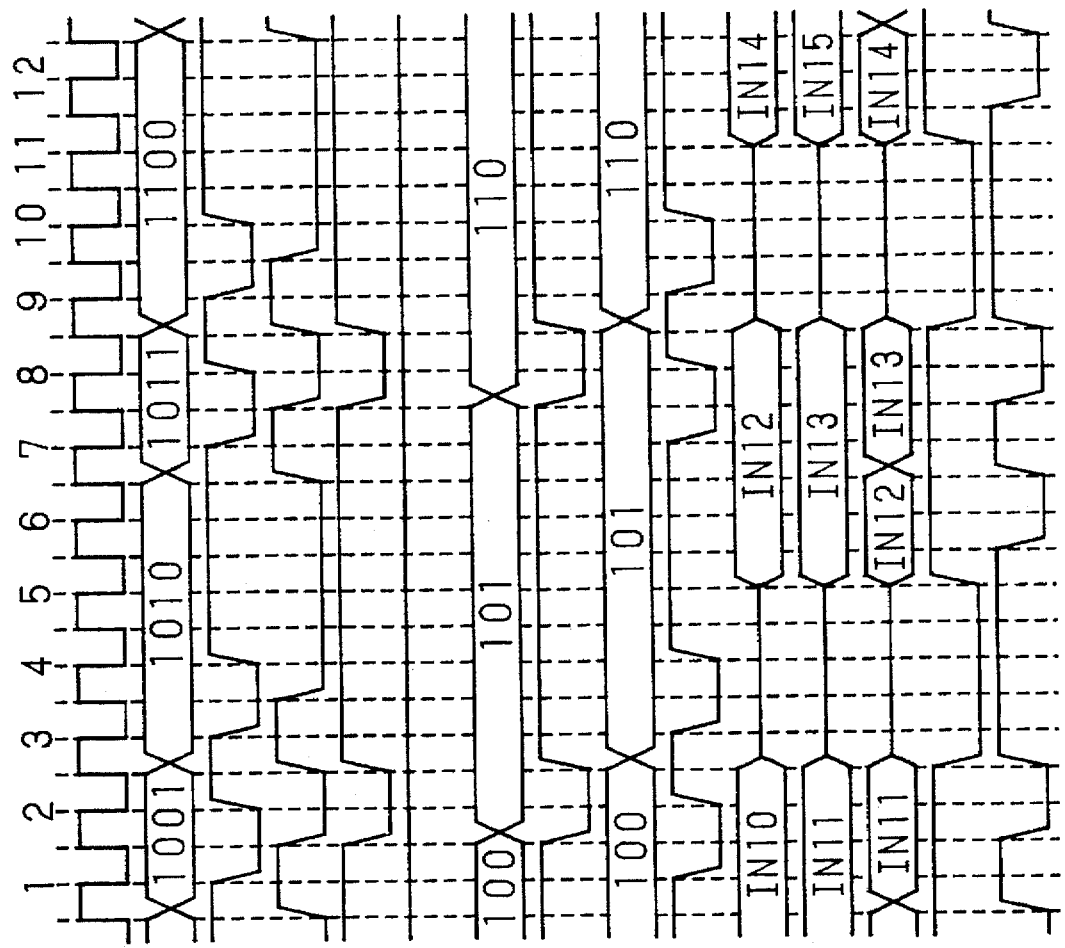

CYCLE
15: CLOCK SIGNAL
10: ADD. BUS
12: AS SIGNAL
13: DS SIGNAL
19: COUNT SIGNAL
20: LOAD SIGNAL
16: COUNTER OUTPUT BUS
21: PA SIGNAL
17: PRE-OUTPUT ADD. BUS
18: HIT SIGNAL
22A: OUTPUT BUS
22B: OUTPUT BUS
11: DATA BUS
44: OUTPUT SIGNAL OF DELAY CIRCUIT 39
14: DC SIGNAL

MICROPROCESSOR HAVING ADDRESS PRE-OUTPUTTING FUNCTION AND DATA PROCESSOR USING THE SAME

BACKGROUND OF THE INVENTION

1. Field of the Invention

The present invention relates to a microprocessor and a data processor using the same, and more particularly to a microprocessor, in which an access time to an external memory connected to the outside of the microprocessor is shortened, and a data processor using the same.

2. Description of the Related Art

FIG. 1 is a block diagram showing a configuration of a data processor, in which a conventional microprocessor reads instructions from an external memory. The conventional microprocessor described in the following is based on the contents disclosed in "M32 FAMILY USER'S MANUAL" issued June 1989, pp14–pp36 with respect to M32210GS-20/FP-20 made by Mitsubishi Electric Co., Ltd.

In FIG. 1, numeral 103 designates the conventional microprocessor, numeral 98 designates an external memory connected to the outside of the microprocessor 103, and numeral 99 designates a response circuit. Numeral 10 designates an address bus for inputting an address outputted from the microprocessor 103 to the external memory 98, and numeral 11 designates a data bus for inputting data outputted from the external memory 98 to the microprocessor 103.

The external memory 98 stores the instructions being executed by the microprocessor 103. As to be described later, the response circuit 99 controls timing of the instruction read on the data bus 11 by the microprocessor 103, when the microprocessor 103 accesses the external memory 98.

Numeral 12 designates an address strobe signal (hereinafter, referred to as the AS signal) outputted from the microprocessor 103 and inputted to the response circuit 99, which indicates that a valid address has been outputted to the address bus 10 from the microprocessor 103 for accessing the external memory 98.

Numeral 13 designates a data strobe signal (hereinafter, referred to as the DS signal) outputted from the microprocessor 103 and inputted to the response circuit 99, which indicates that the microprocessor 103 is reading data from the data bus 11.

Furthermore, numeral 14 designates a data transfer complete signal (hereinafter, referred to as the DC signal), which indicates that the valid data is outputted to the data bus 11 from the external memory 98.

In addition, numeral 15 designates a clock signal inputted to the microprocessor 103 and the response circuit 99.

FIG. 2 is a block diagram showing an example of a specific configuration of the response circuit 99 shown in FIG. 1.

In FIG. 2, numeral 12 to 15 respectively designate like constituent elements shown in FIG. 1.

Numeral 100 designates a delay circuit constituted by a counter or a shift register and the like, and numeral 101 designates a flip-flop (hereinafter, referred to as the FF). Numeral 102 designates an output signal from the delay circuit 100, which is inputted to a set terminal S of the FF 101.

The AS signal 12 and clock signal 15 are inputted to the delay circuit 100, the DS signal 13 is inputted to a reset terminal R of the FF 101, and the DC signal 14 is outputted from an output terminal #Q (# represents a inverted signal) of the FF 101.

FIG. 3 is a schematic view showing an example of instruction arrangement in the external memory 98.

A 10th instruction IN10 is to be arranged in an address "1000" ("xxxx" represents a binary number), an 11th instruction IN11 in an address "1001", a 12th instruction IN12 in an address "1010", a 13th instruction IN13 in an address "1011", a 14th instruction IN14 in an address "1100', a 15th instruction IN15 in an address "1101", a 20th instruction IN20 in an address "100000", a 21st instruction IN21 in an address "100001", a 22nd instruction IN22 in an address "100010" and a 23rd instruction IN23 in an address "100011".

Next, the operation of reading data from the external memory 98 by the conventional microprocessor 103 is described.

At first, the operation of the response circuit 99 shown in FIG. 1 is described with reference to FIG. 2.

In the following description, the AS signal 12, DS signal 13 and DC signal 14 are to be all negative logics (L level at active), a transition point from an L level to an H level of respective signal values is called a rising and a transition point from the H level to the L level is called a falling.

When the AS signal 12 becomes the L level, the delay circuit 100 starts to count the number of times of rising of the clock signal 15, and after counting a predetermined number of times (the number of times set in response to the access time of the external memory 98 and the frequency of the clock signal 15) of rising of the clock signal 15, makes its own output signal 102 be in the H level and returns it to the L level at a next time point of falling of the clock signal 15. For example, when the predetermined number of times are 3, the output signal 102 becomes the H level at the third time point of rising of the clock signal 15 from a time point at which the AS signal 12 becomes the L level, and thereafter, the H level of the output signal 102 is maintained while the clock signal 15 is in the H level.

The FF 101 is set at the time point of rising of the output signal 102 of the delay circuit 100 to make the DC signal 14 which is its own output signal be in the L level, and is reset at the time point of rising of the DS signal 13 to return the DC signal 14 to the H level.

Thus, the response circuit 99 counts the number of times of rising of the clock signal 15 by the predetermined number of times from the time point at which the AS signal 12 becomes the L level to make the DC signal 14 be in the L level at the time point of rising of the clock signal 15, and returns the DC signal to the H level at the time point of rising of the DS signal 13.

Next, the operation the instruction reading by the conventional microprocessor 103 as mentioned above is described.

In operation, the microprocessor 103 reads the instructions sequentially, in other words, in order of addresses from the external memory 98 for execution, except the case where the execution instruction sequence changes due to execution of the branch instruction or occurrence of interruptions or the like. For example, the microprocessor 103 is to read the 11th instruction IN11 in the address "1001", 12th instruction IN12 in the address "1010", 13th instruction IN13 in the address "1011 and 14th instruction IN14 in the address "1100" in the external memory 98 in order.

In the following, for convenience of sake of the description, the microprocessor 103 is to read one instruction in one bus cycle, and as shown in timing charts of FIG. 4 and FIG. 5 to be described later, respective cycles of the clock signal 15 are numbered.

FIG. 4 is a timing chart for explaining an example of operation of the conventional microprocessor 103 to read instructions from the external memory 98.

In the timing chart shown in FIG. 1, the operation of the microprocessor 103 to read the 11th instruction IN11 in the address "1001", 12th instruction IN12 in the address "1010", 13th instruction IN13 in the address "1011" and 14th instruction IN14 in the address "1100" in order, when the access time (a time from a time point at which an address to be accessed has been asserted till the output of valid data to the data bus 11) of the external memory 98 is relatively a long 120 ns and the frequency of the clock signal 15 is 20 MHz (a cycle is 50 ns), is shown.

FIG. 5 is a timing chart for explaining another example of operation of the conventional microprocessor 103 to read the instruction from the external memory 98.

In the timing chart shown in FIG. 5, the operation of the microprocessor 103 to read the 11th instruction IN11 in the address, "1001", 12th instruction IN12 in the address "1010", 13th instruction IN13 the address "1011" and the 14th instruction IN14 in the address "1010" in the external memory 98 in order, when the access time of the external memory 98 is a relatively short 20 ns and the frequency of the clock signal 15 is 20 MHz, is shown.

At first, referring to the timing chart shown in FIG. 4, the operation of the conventional microprocessor 103 to read the instructions sequentially from the external memory 98, when the access time of the external memory 98 is a relatively long 120 ns and the frequency of the clock signal 15 is 20 MHz, is described. As a count value of the delay circuit 100 in the response circuit 99, "3" is to be set.

The microprocessor 103 reads the 11th instruction IN11 in the address "1001" from a cycle 1 of the clock signal 15 shown in FIG. 4. In the following, a rising of the clock signal 15 of cycle n is defined as a transition point from the L level of the clock signal 15 of cycle n-1 to the H level of the clock signal 15 of cycle n, in other words, the rising.

At the time point of rising of the clock signal 15 of cycle 1, the address "1001" is outputted to the address bus 10 from the microprocessor 103 and is inputted to the external memory 98. At a time point of falling of the clock signal 15 of cycle 1, the microprocessor 103 indicates to the response circuit 99 that the valid address has been outputted by making the AS signal 12 be in the L level. At a time point of rising of the clock signal 15 of cycle 2, the microprocessor 103 indicates to the response circuit 99 that the microprocessor 103 is reading data by making the DS signal 13 be in the L level. Thereafter, the microprocessor 103 returns the AS signal 12 to the H level at a time point of falling of the clock signal 14 of cycle 2.

The external memory 98 outputs the valid data (in this case, the 11th instruction IN11) to the data bus 11, after 120 ns (during the L level of the clock signal 15 of cycle 3) from the assertion of address to be inputted from the microprocessor 103 via the address bus 10. The response circuit 99 counts the number of times of rising of the clock signal 15 from the time point of rising of the clock signal 15 during the L level of the AS signal 12, and by making the DC signal 14 be in the L level at the time point of rising of the clock signal 15 at which the count number becomes "3" (a time point of rising of the clock signal 15 of cycle 4), indicates to the microprocessor 103, that the external memory 98 is outputting the valid data (in this case, the 11th instruction IN11) by making the DC signal 14 be in the L level.

A rising of the clock signal 15 of cycle 4 corresponds to the first rising of the clock signal 15 from the assertion of data (in this case, the 11th instruction IN11) output from the external memory 98 on the data bus 11. When detecting that the DC signal 14 becomes the L level, the microprocessor 103 reads the data (in this case, the 11th instruction IN11) of the data bus 11 and indicates to the response circuit 99 that the data has been read by returning the DS signal 13 to the H level, at the next time point of rising of the clock signal 15 (a time point of rising of the clock signal 15 of cycle 5). The response circuit 99 returns the DC signal 14 to the H level at the time point of rising of the DS signal 13.

During the above-mentioned four cycles from the cycle 1 to the cycle 4, the microprocessor 103 completes the reading of the 11th instruction IN11 in the address "1001" of the external memory 98.

By repeating the same operations as the four cycles from the cycle 1 to the cycle 4 in respective cycles from the cycle 5 to the cycle 8, from the cycle 9 to the cycle 12 and from the cycle 13 to the cycle 16 by changing the addresses in order of "1011", "1011" and "1100", the microprocessor 103 reads the 12th instruction IN12 in the address "1010", 13th instruction IN13 in the address "1011" and 14th instruction IN14 in the address "1100" from the external memory 98 in order.

Next, referring to FIG. 5, the operation of the conventional microprocessor 103 to read the instructions sequentially from the external memory 98, when the access time of the external memory 98 is a relatively short 20 ns and the frequency of the clock signal 15 is 20 MHz, is described.

However, different from the above-mentioned case, in this case, a count value of the delay circuit 100 in the response circuit 99 is to be set to "1". The reason for using the memory having such relatively short access time is to shorten the time required by the microprocessor 103 to read the instruction from the external memory 98.

From the cycle 1 of the clock signal 15, the 11th instruction IN11 in the address "1001" is read. At the time point of rising of the clock signal 15 of cycle 1, the address "1001" is outputted to the address bus 10 from the microprocessor 103 and is inputted to the external memory 98. At the time point of falling of the clock signal 15 of cycle 1, the microprocessor 103 indicates to the response circuit 99 that it has outputted the valid data by making the AS signal 12 be in the L level, and at a time point of rising of the clock signal 15 of cycle 2, indicates to the response circuit 99 that the microprocessor 103 is reading data by making the DS signal 13 be in the L level. Thereafter, the microprocessor 103 returns the AS signal 12 to the H level at a time point of falling of the clock signal 15 of cycle 2.

The external memory 98 outputs the valid data (in this case, the 11th instruction In11) to the data bus 1, after 20 ns (during the L level of the clock signal 15 of cycle 1) from a time point of the assertion of address inputted from the microprocessor 103 via the address bus 10. The response circuit 99 counts the number of times of rising of the clock signal 15 from the time point of rising of the clock signal 15 during the L level of the AS signal 12, and indicates to the microprocessor 103 that the external memory 98 is outputting the valid data (in this case, the 11th instruction IN11) by making the DC signal 14 be in the L level at the time point of rising of the clock signal 15 at which the count number becomes "1" (in this case, the time point of rising of the clock signal 15 of cycle 2).

The rising of the clock signal 15 of cycle 2 is the first rising of the clock signal 15 from the assertion of data (in this case, the 11th instruction IN11) output from the external memory 98 on the data bus 11. When detecting that the DC signal 14 becomes the L level, the microprocessor 103 reads the data (in this case, the 11th instruction IN11) on the data bus 11, returns the DS signal 13 to the H level at the next time point of rising (a time point of rising of the clock signal 15 of cycle 3) of the clock signal 15 and indicates to the response circuit 99 that the data has been read. The response circuit 99 returns the DC signal 11 to the H level at the time point of rising of the DS signal 13.

During the above 2 cycles of the cycle 1 to the cycle 2, the microprocessor 103 completes the reacting of the 11th instruction IN11 in the address "1001" of the external memory 98.

Thereafter, in periods of respective two cycles from the cycle 3 to the cycle 4, from the cycle 5 to the cycle 6 and from the cycle 7 to the cycle 8, by repeating the same operations as the two cycles from the cycle 1 to the cycle 2 by changing the addresses in order of "1010", "1011" and "1100", the microprocessor 103 reads the 12th instruction IN12 in the address "1010", 13th instruction IN13 in the address "1011" and 14th instruction IN14 in the address "1100" from the external memory 98 in order.

Now, when the branch instruction is executed or interruption is generated, though the microprocessor 103 sometimes reads the instructions non-sequentially, each instruction reading operation itself is as same as the case where the instructions are read sequentially as described above.

The case where the instructions are read non-sequentially corresponds to the case, where, for example, the microprocessor 103 reads the 10th instruction IN10 in the address "1000", 11th instruction IN11 in the address "1001", 12th instruction IN12 in the address "1010", 13th instruction IN13 in the address "1011", 20th instruction IN20 in the address "100000", 21st instruction IN21 in the address "100001" and 22nd instruction IN22 in the address "100010" from the external memory 98 in order.

For certain reasons of processing by the microprocessor 103, sometimes instruction read bus cycles are not in sequence. In such case, a cycle of the clock signal 15 in which the instruction is not read is present between one instruction read bus cycle and a succeeding instruction read bus cycle.

As described above, the operation of the microprocessor 103 in one bus cycle for reading each instruction from a certain address of the external memory 98, is always performed in four cycles (200 ns) of the clock signal 15 as the operations shown in the cycle 1 to the cycle 4 in FIG. 4, when the external memory 98 is the memory in which the access time is relatively a long 120 ns and the frequency of the clock signal 15 is 20 MHz, while the operation is always performed in two cycles (100 ns) of the clock signal 15 as the operation shown in the cycle 1 to the cycle 2 in FIG. 5, when the external memory 98 is the memory in which the access time is a relatively short 20 ns and the frequency of the clock signal 15 is 20 MHz.

As above, though it has been specifically described in the conventional example for the case where the microprocessor accesses the memory of a relatively long access time, and the case of accessing the memory of a relatively short access time, in general, a memory having a relatively short access time is expensive, and conversely, an inexpensive memory has a relatively long access time.

And hence, in a data processing system using the conventional microprocessor, though it is possible to cut system cost by using the memory having the relatively long access time, since the time required for accessing the memory becomes longer as described above, execution speed of the system is lowered as a whole. This becomes more remarkable, when the microprocessor reads sequential data from the memory continuously. Thus, in order to shorten the time required for accessing the memory to increase the execution speed of the system as a whole, as described above, it is necessary to use the memory having the relatively short access time. However, since the memory having the short access time is expensive, the system cost becomes high.

From such point of view, techniques for reading out data rapidly from the memory having the relatively long access time are required have been proposed, for example, the inventions as seen in the Japanese Patent Application Laid-Open No. 2-153444 (1990), Japanese Patent Application Laid-Open No. 63-129438 (1988) and Japanese Patent Application Laid-Open No. 1-128143 (1989).

The Japanese Patent Application Laid-Open No. 2-153444 (1990 is constituted such that, the memory is divided into an even address area and odd address area, the two areas are accessed simultaneously by an address excluding a least significant bit of the address outputted from a microprocessor, and either of the areas is selected by the least significant bit to write data into one area and to read data out from the other area.

Though some effects can be expected when the data is alternately written into and read from the memory, there is hardly any effects when reading the sequential data from the memory.

The Japanese Patent Application Laid-Open No. 63-129438 (1988 is constituted such that, the memory is divided into an even address area and an odd address area, and by including an incrementer, which, during accessing one area by the address outputted from the microprocessor, generates the other address by incrementing "1", both the even address area and the odd address area accessed.

In such configuration, though it is possible to read out the data stored in two consecutive addresses headed by the odd address of the memory, or in two consecutive addresses headed by the even address by just outputting one address from the microprocessor, when reading the sequential data out from the memory, the same operation as the conventional general operation is performed.

Furthermore, the Japanese Patent Application Laid-Open No. 1-128143 (1989 is constituted such that, the memory is divided into the even address area and the odd address area, and by including an adder which adds the address excluding a least significant bit of the address outputted from the microprocessor and the least significant bit, both the even address area and the odd address area accessed.

In such configuration, as same as the above-mentioned Japanese Patent Application Laid-Open No. 63-129438 (1988), though it is possible to read data stored in the two consecutive addresses of the memory by just outputting one address from the microprocessor, when reading t.e sequential data out from the memory, the same operation as the conventional general operation is performed.

As such, the techniques disclosed in the above-mentioned Japanese Patent Application Laid-Opens, are a system of specific use in which data is written into one of the adjoining addresses of the memory and read out from the other address, or a technique of reading out the data stored across the two adjoining address of the memory by one access, whereby a controversial rapid access may be possible. However, they are not too effective for shortening the access time as a whole when reading a number of sequential data continuously from the memory.

SUMMARY OF THE INVENTION

The present invention has been devised to solve the above-mentioned problems, and, therefore, it is an object thereof to provide a microprocessor and a data processor using the same, in which, in a system using a memory having a relatively long access time, the time required for access can be shortened as a whole by giving a next address to be accessed to an external memory beforehand in the case of reading sequential data continuously, and further, by comparing the address to be accessed actually and the address given to the external memory beforehand, it is possible to avoid the case where the memory is not accessed sequentially and the address given to the external memory beforehand differs from the address which is actually accessed.

A microprocessor of a first invention of the present invention accesses a first area to which even addresses among actual addresses indicating positions to be accessed in a memory are allocated and a second area to which odd addresses among the same are allocated, by outputting common addresses excluding a least significant bit from the actual addresses, and comprises: a microprocessor core which generates the actual addresses; an address counter which generates a value as a pre-output address value obtained by, at every accessings to the second area, sequentially incrementing the value from an initial value obtained by excluding the least significant bit from the actual address generated by the microprocessor core at a time point of starting of accessing to the memory; an address latch which latches the pre-output address value generated by the address counter, and which outputs it to the outside to give it to the memory; a control circuit which allows the address latch to latch the pre-output address value generate by the address counter to give it to the memory after accessing to the second area; and an address comparator which, at the time of accessing to the first and second areas, compares the value excluding the least significant bit of the actual address outputted by the microprocessor core and the pre-output address value latched by the address latch, and outputs a bit signal when they coincide with each other; whereby the control circuit allows the address counter and the address latch to latch the value obtained by excluding the least significant bit from the actual address outputted by the microprocessor core when the address comparator is not outputting the hit signal at accessing to the first and second areas.

A data processor of the first invention is constituted by, the microprocessor as described above, and the memory which is divided into the first area to which the even addresses are allocated and the second area to which the odd addresses are allocated, and is accessed by the microprocessor core.

A microprocessor of a second invention of the present invention accesses a first area to which even addresses among actual addresses indicating positions to be accessed in a memory are allocated and a second area to which odd addresses among the same are allocated, by outputting common addresses excluding a least significant bit from the actual addresses, and comprises: a microprocessor core which generates the actual addresses; an address counter which generates a value as a pre-output address value obtained by, at every accessings to the second area, sequentially incrementing the value from an initial value obtained by excluding the least significant bit from the actual address generated by the microprocessor core at a time point of starting; accessing to the memory, and which outputs the pre-output address value to the outside to give it to the memory; a first address latch which latches the pre-output address value generated by the address counter; a second address latch which latches the pre-output address value generated by the address counter; a control circuit which allows the first address latch to, at every completion of accessing to the first area, latch the pre-output address value generated by the address counter, and which allows the second address latch to, at every completion of accessing to the second area, latch the pre-output address value generated by the address counter; an address latch selector which selects the pre-output address value latched by the first latch when the actual address value outputted to the microprocessor core is even, and which selects the pre-output address value latched by the second latch when the actual address value outputted by the microprocessor core is odd; and an address comparator which, at the time of accessing to the first and second areas, compares the value excluding the least significant bit of the actual address outputted by the microprocessor core and the pre-output address value outputted by the address latch selector, and outputs a hit signal when they coincide with each other; whereby the control circuit allows the address counter to latch the value excluding the least significant bit from the actual address outputted by the microprocessor core when the address comparator is not outputting the hit signal at accessing to the first and second areas.

A data processor of the second invention is constituted by the microprocessor as described above and the memory which is divided into the first area to which the even address is allocated and the second area to which the odd address is allocated, and is accessed by the microprocessor core In the first invention of the present invention, during accessing the first area of the memory, the address value is given to the second area beforehand, and when the first area is not accessed successively after accessing of the second area, the address value is also given to the first area beforehand. Also, when the address value given to the first and second areas of the memory beforehand is different from the value excluding the least significant bit from the actual address, since it is detected by the comparative result of the address comparator, the value excluding the least significant bit from the actual address is latched in the address counter and the address latch by the control circui is given to the first and second areas for access with the proper address.

In the second invention of the present invention, during the first area of the memory is accessed, the address value is given to the second area beforehand, and during the second area is accessed, the address value is given to the first area beforehand. Also, when the address value given to the first and second areas of the memory beforehand is different from the value excluding the least significant bit from the actual address, since it is detected by the comparative result of the address comparator, the value excluding the least significant bit from the actual address is latched in the address counter by the control circuit, and is given to the first and second areas for access with the proper address.

The above and further objects and features of the invention will more fully be apparent from the following detailed description with accompanying drawings.

BRIEF DESCRIPTION OF THE DRAWINGS

FIG. 3 is a schematic view showing an example of arrangement of instructions in a memory to be accessed by a conventional microprocessor, FIG. 9A is a schematic view showing an example of arrangement of instructions in a first memory bank of a memory to be accessed by a microprocessor of the present invention, FIG. 9B is a schematic view showing an example of arrangement of instructions in a second memory bank of a memory to be accessed by a microprocessor of the present invention, FIG. 10 is a timing chart for explaining an operation example for reading instructions from a memory by a microprocessor of a first invention of the present invention.

DESCRIPTION OF THE PREFERRED EMBODIMENTS

In the following, the present invention is particularly described based on the drawings showing its embodiments.

At first, a first invention is described.

Figure 6:
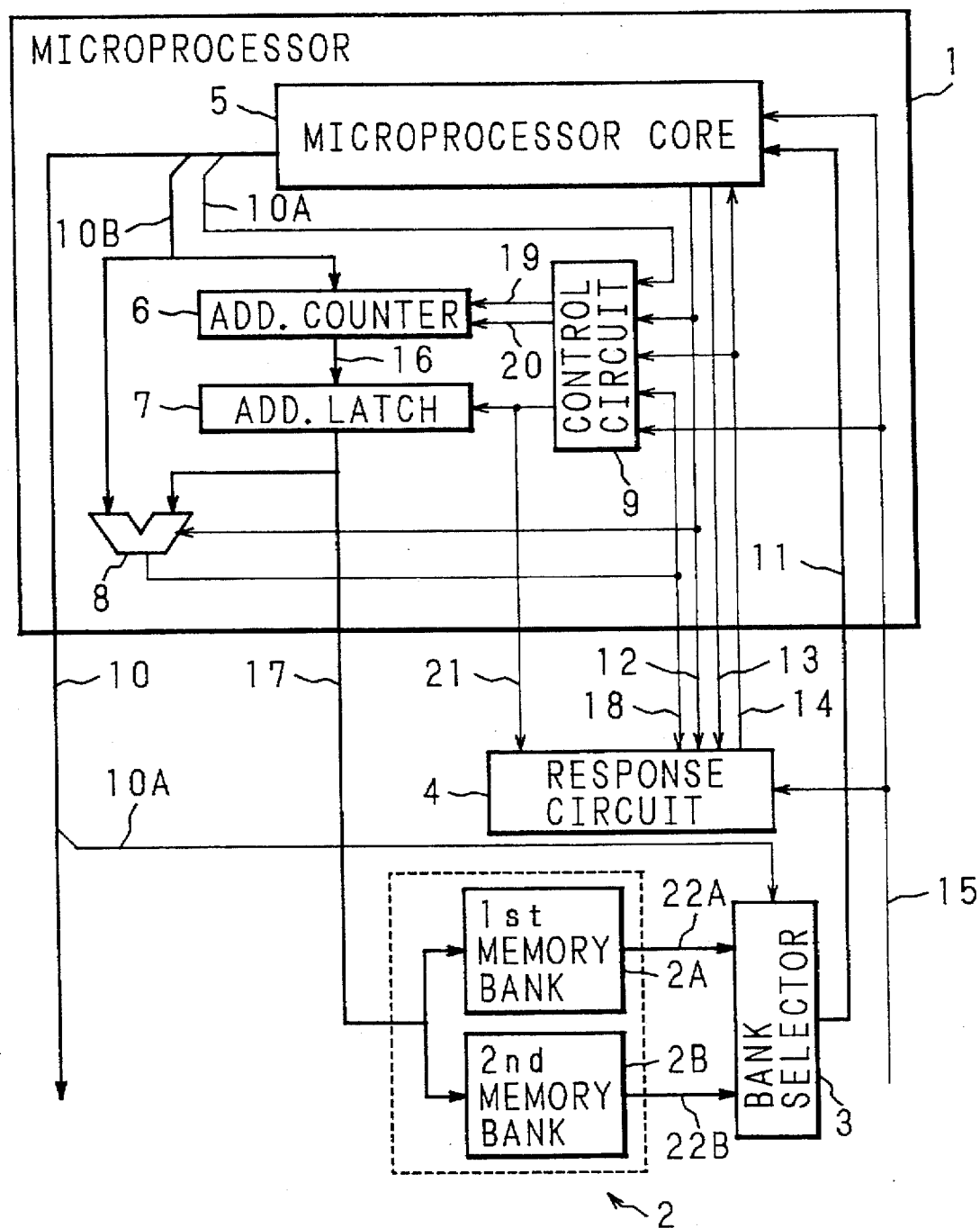
FIG. 6 is a block diagram showing one embodiment of a configuration, in which a microprocessor of a first invention of the present invention reads instructions from an external memory.

FIG. 6 is a block diagram showing one embodiment of a configuration of a data processor, in which a microprocessor of the first invention of the present invention reads instructions from an external memory. In FIG. 6, like reference characters of FIG. 1 referred to in describing the aforementioned conventional example designate like or corresponding parts.

In FIG. 6, numeral 1 designates a microprocessor of the present invention, numeral 2 designates an external memory connected to the outside of the microprocessor 1, numeral 3 designates a bank selector and numeral 4 designates a response circuit.

The external memory 2 stores the instructions executed by the microprocessor 1, and is constituted by a first memory bank 2A and a second memory bank 2B.

As to be described later, the response circuit 4 controls the timing of the microprocessor 1 to read the instructions from a data bus 11 when the microprocessor 1 accesses the external memory 2.

Figure 1:
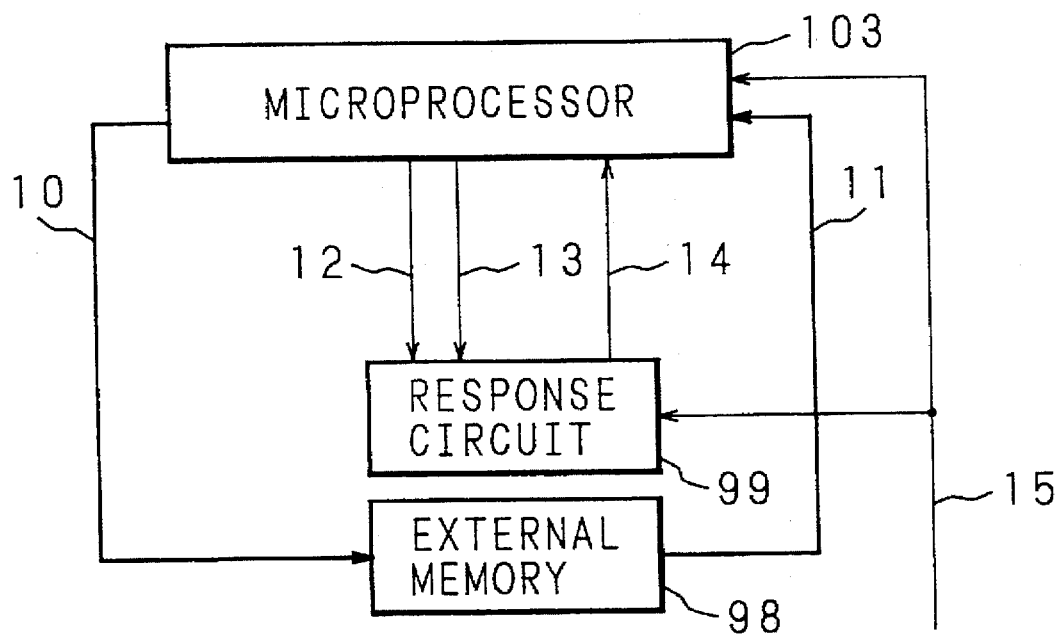
FIG. 1 is a block diagram showing a configuration of a data processor, in which a conventional microprocessor reads instructions from an external memory.
Figure 2:
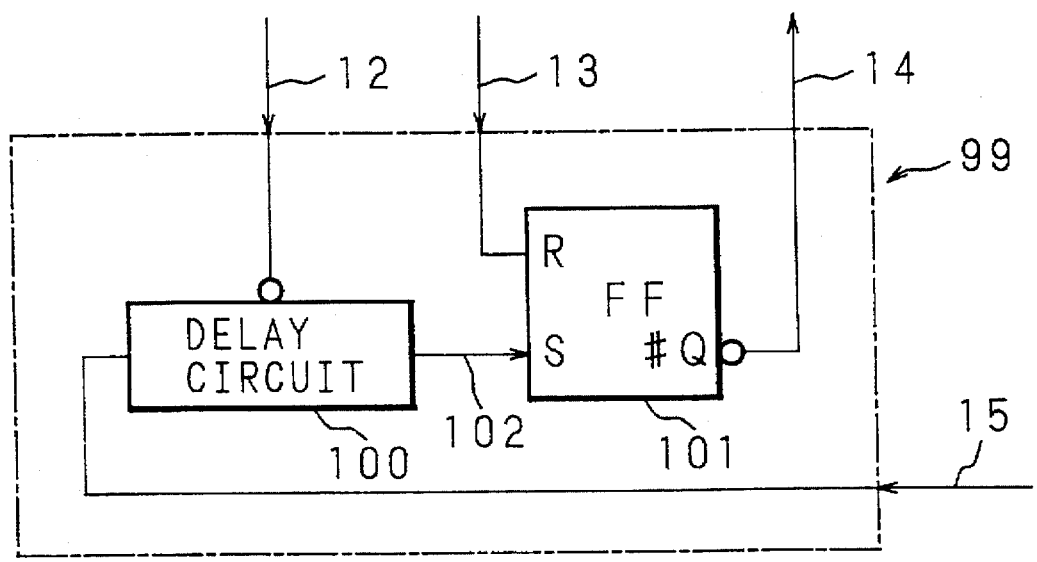
FIG. 2 is a circuit diagram showing a configuration example of a control circuit connected to the outside of a microprocessor in a conventional data processor.
Figure 4:
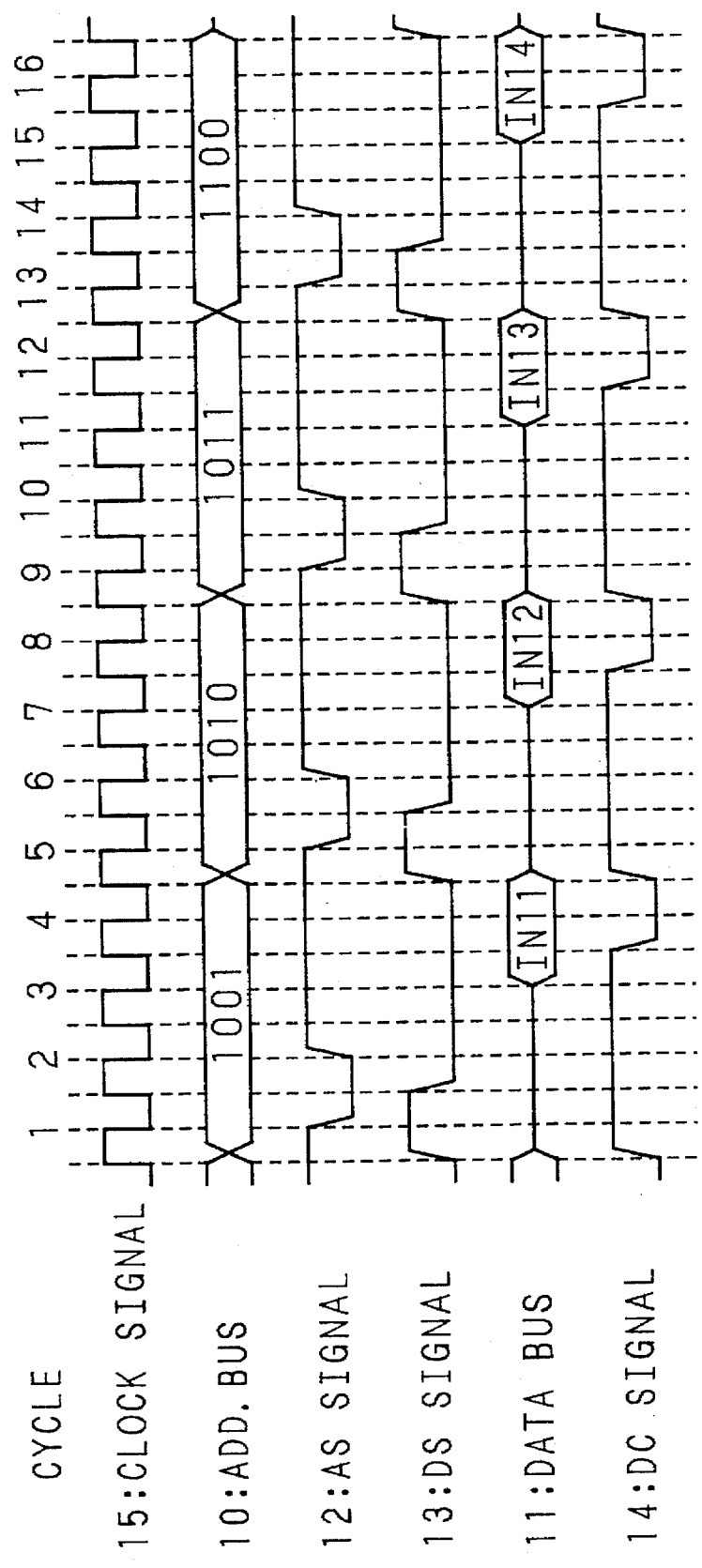
FIG. 4 is a timing chart for explaining an operation example for reading instruction from a memory by a conventional microprocessor.
Figure 5:
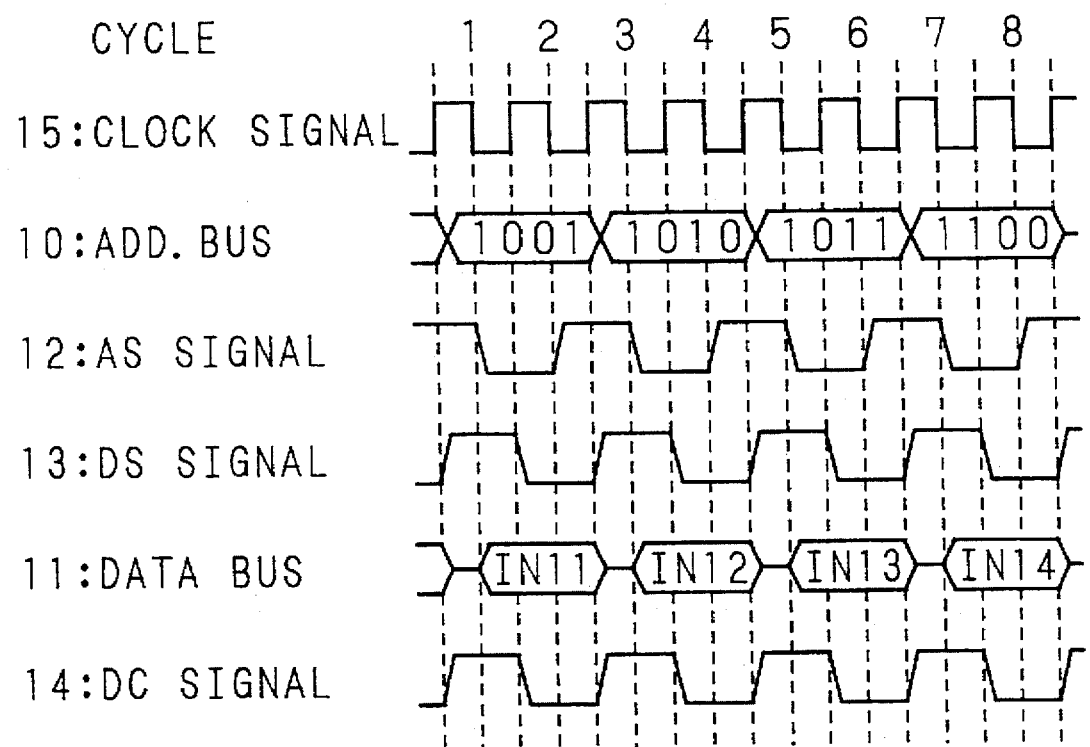
FIG. 5 is a timing chart for explaining another operation example for reading instruction from a memory by a conventional microprocessor.

Numeral 5 designates a microprocessor core in the microprocessor 1, which corresponds to a conventional microprocessor 103 shown in FIG. 1.

Though an address is outputted to an address bus 10 from the microprocessor core 5, a least significant bit 10A thereof is inputted to a control circuit 9, and an address other than the least significant bit 10A is inputted to an address counter and an address comparator 8 on address bus 10B. The address bus 10 is also outputted to the outside of the microprocessor 1, and the least significant bit 10A is also inputted to the bank selector 3.

The control circuit 9 controls the address counter 6 in response to the above-mentioned least significant bit 10A of the address bus 10 and various signals, as to be described later, given from the microprocessor core 5 and the response circuit 4.

Different from an address counter which is always included in a usual von Neumann type microprocessor, the address counter 6 is controlled by the above-mentioned control circuit 9. Address counter 6 loads and holds a value from the address bus 10B other than the least significant bit 10A, and increments the value by '1' and holds it. The value held by the address counter 6 is always outputted to an output bus 16 connected to an address latch 7.

However, such counter can be easily constituted by a usual general counter.

Though an address counter for indicating the instruction address to be processed next is always included in the usual von Neumann type microprocessor, the above-mentioned address counter f' is provided separately outside of the microprocessor core 5.

The address latch 7 is controlled by the control circuit 9, and fetches and latches a value outputted to the output bus 16 by the address counter 6, and always outputs the latched value to a pre-output address bus 17.

The address comparator 8 is controlled by the microprocessor core 5, and compares the value of the address bus 10B other than the least significant bit 10A and the value latched by the address latch 7, and outputs a low active pre-output address hit signal 18 when they coincide with each other.

The value latched by the address latch 7 is given also to the first memory bank 2A and the second memory bank 2B.

Numeral 11 designates a data bus, which inputs data outputted from the bank selector 3 to the microprocessor core 5 in the microprocessor 1.

Numeral 12 designates an address strobe signal (hereinafter, referred to as the AS signal), which indicates that a valid address is outputted to the address bus 10 from the microprocessor core 5 for accessing the external memory 2. The AS signal 12 is outputted from the microprocessor core 5 and inputted to the address comparator 8 and control circuit 9, and also outputted to the outside of the microprocessor 1 and inputted to the response circuit 4.

Numeral 13 designates a data strobe signal (hereinafter, referred to as the DS signal), which indicates that the microprocessor core 5 is reading the data from the data bus 11. The DS signal 13 is outputted from the microprocessor core 5, outputted to the outside of the microprocessor 1 and inputted to the response circuit 4.

Numeral 14 designates a late transfer complete signal (hereinafter, referred to as the DS signal), which indicates that valid data is outputted to the data bus 11 from the memory 2. The DC signal 14 is outputted from the response circuit 4, inputted to the microprocessor 1 and to the microprocessor core 5, and also to the control circuit 9.

Numeral 15 designates a clock signal, which is inputted to the response circuit 4, to the microprocessor 1 and to the microprocessor core 5 and to the control circuit 9.

The above-mentioned numerals 10 to 15 correspond to the numerals 10 to 15 of FIG. 1 showing the conventional example.

Numeral 16 designates an output bus of the address counter 6, which is outputted from the address counter 6 and inputted to the address latch 7.

Numeral 17 designates a pre-output address bus which is outputted from the address latch 7 and inputted to the address comparator 8, and also outputted outside of the microprocessor 1 and inputted to the first memory bank 2A and the second memory bank 2B.

Numeral 18 designates a pre-output address hit signal (hereinafter, referred to as the HIT signal), which is outputted from the address comparator 8 and inputted to the control circuit 9, and also outputted outside of the microprocessor 1 and inputted to the response circuit 4.

Numeral 19 designates a count signal which is outputted from the control circuit 9 and inputted to the address counter 6, and numeral 20 designates a load signal which is outputted from the control circuit 9 and inputted to the address counter 6.

Numeral 21 designates a pre-output address output signal (hereinafter, referred to as the PA signal), which is outputted from the control circuit 9 and inputted to the address latch 7, and also outputted outside of the microprocessor 1 and inputted to the response circuit 4.

Numeral 22A designates a first bank output bus which is outputted from the first memory bank 2A of the memory 2 and inputted to the bank selector 3, and numeral 22B designates a second bank output bus which is outputted from the second memory bank 28 of the memory 2 and inputted to the bank selector 3.

Figure 7:
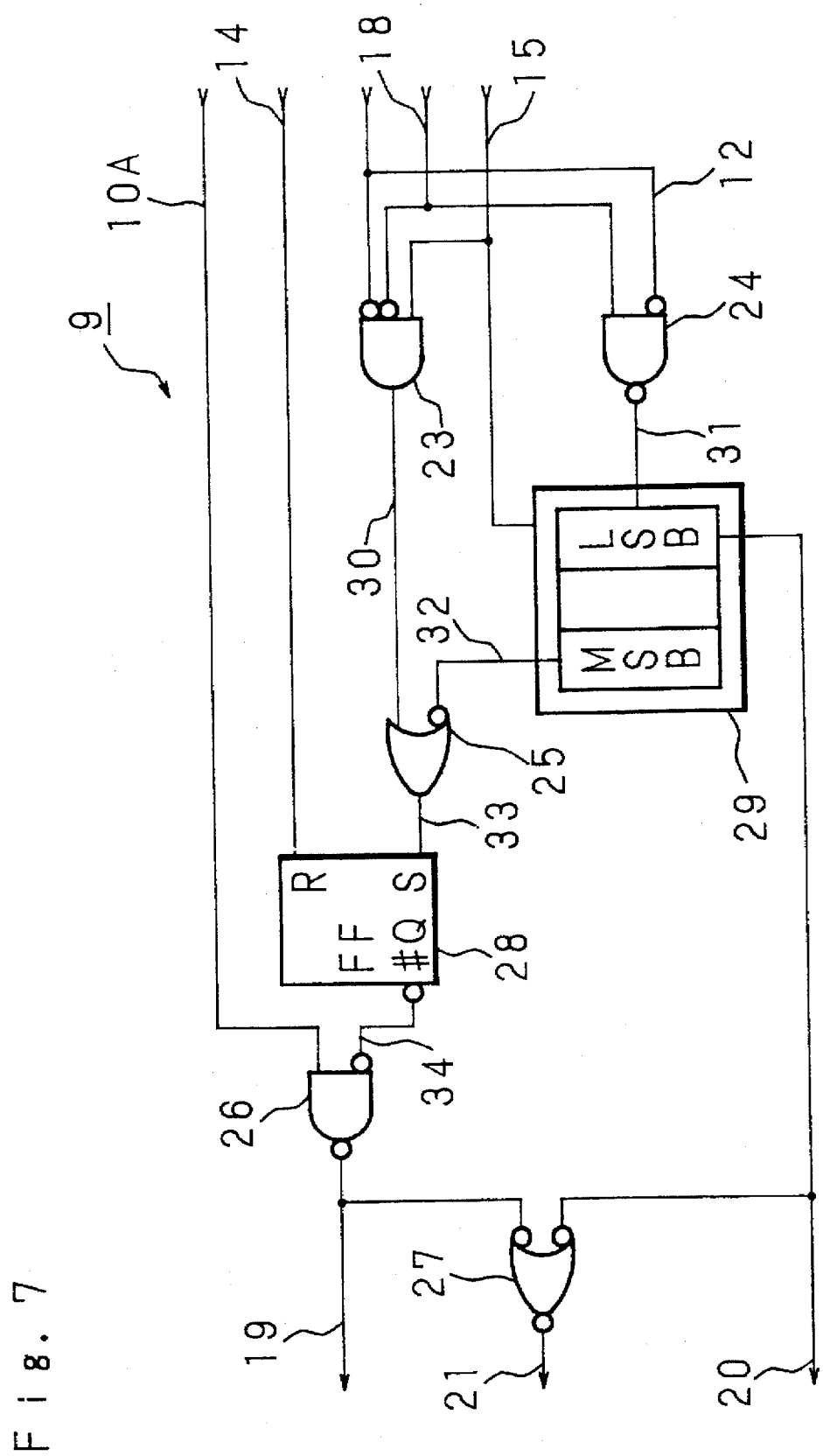
FIG. 7 is a circuit diagram showing a configuration example of a control circuit included in a microprocessor of a first invention of the present invention.

FIG. 7 is a circuit diagram showing a configuration example of the control circuit 9 included in the microprocessor 1. In FIG. 7, numerals 10A, 12, 14, 15, 18, 19, 20 and 21 designate like constituent devises shown in FIG. 6.

In FIG. 7, numerals 23, 24, 25, 26 and 27 designate logic gates. Numeral 28 designates a flip-flop (hereinafter, referred to as the FF), and numeral 29 designates a clock synchronizing type shift register of 3-bit configuration.

The logic gate 23 inputs the AS signal 12, the HIT signal 18 and the clock signal 15 and outputs an output signal 30.

The logic gate 24 inputs the AS signal 12 and the HIT signal 18, and outputs an output signal 31.

The shift register 29 has a 3-bit configuration in this embodiment. The reason is that, though the shift register 29 operates in synchronism with the clock signal 15 of 20 MHz (a cycle is 50 ns), since the access time of the external memory 2 is 120 ns, a time of 3 clocks (150 ns) is secured for one time of accessing to the external memory 2.

The shift register 29 inputs the clock signal 15 as a synchronous signal as described above, and at the same time, inputs the outputs signal 31 of the logic gate 24 to a first bit (the least significant bit: LSB), outputs contents of the first bit as the load signal 20, and outputs content of the third bit (the most significant bit : MSB) as an output signal 32.

The logic gate 25 inputs the output signal 30 of the logic gate 23 and the output signal 32 of the shift register 29, and outputs an output signal 33.

The FF 28 inputs the DC signal 14 to a reset terminal R, and the output signal 33 of the logic gate 25 to a set terminal S, and outputs an output signal 34 from an output terminal #Q (#represents an inverted signal).

The logic gate 26 inputs the output signal 34 of the FF 28 and the least significant bit 10A of the address bus 10, and outputs the count signal 19.

The logic gate 27 inputs the count signal 19 and load signal 20, and outputs the PA signal 21.

Figure 8:
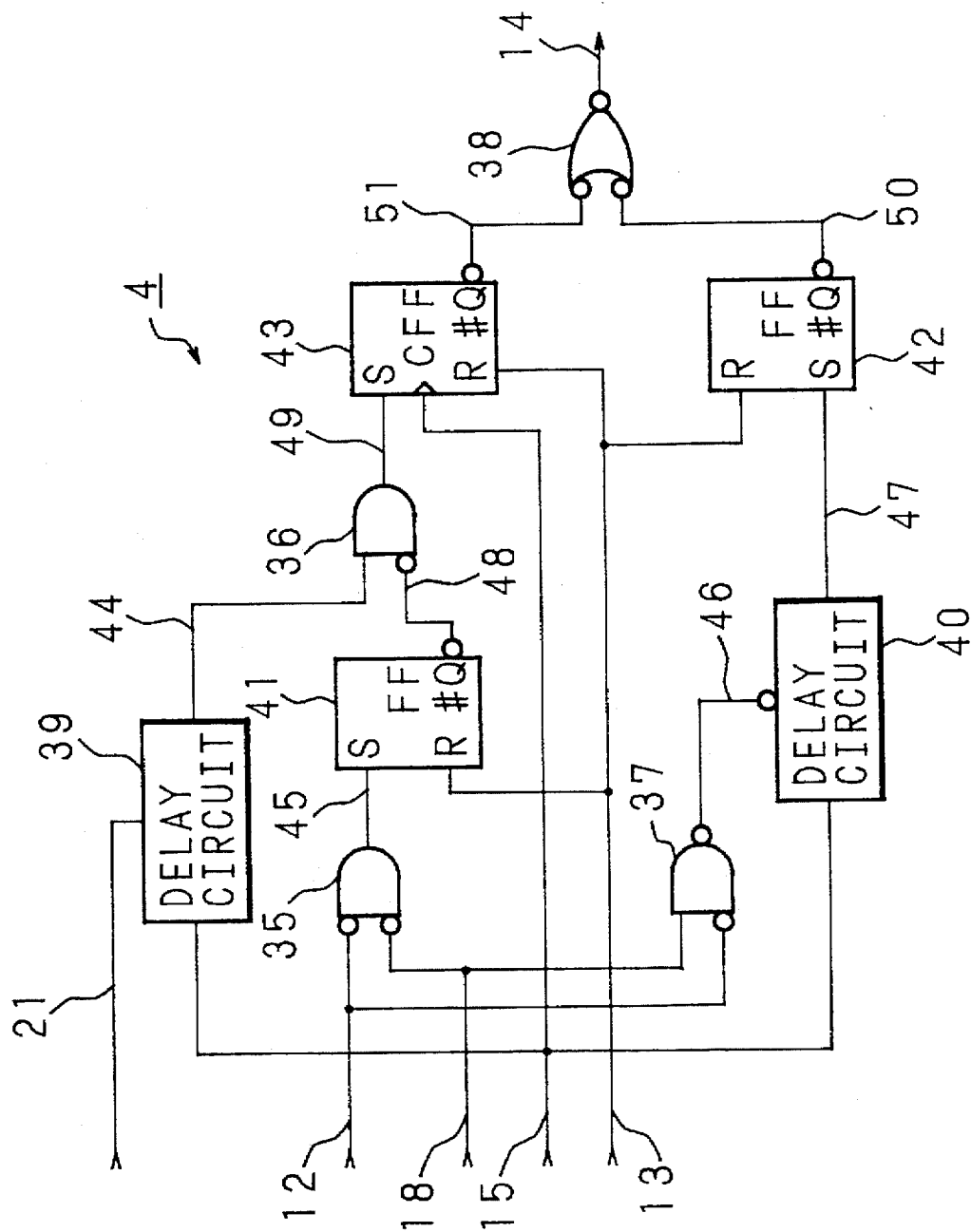
FIG. 8 is a circuit diagram showing a configuration example of a response circuit connected to the outside of a microprocessor of a first invention of the present invention.

FIG. 8 is a circuit diagram showing a configuration example of the response circuit 4 shown in FIG. 6. In FIG. 8, numerals 12, 13, 14, 15, 18 and 21 designate like constituent devises shown in FIG. 6.

Numerals 35, 36, 37 and 38 designate logic gates, and numerals 39 and 40 designate delay circuits. Numerals 41 and 42 designate flip-flops, and numeral 43 designates a clock synchronizing type flip-flop (hereinafter, referred to as the CFF).

The delay circuit 39 inputs the PA signal 21 and the clock signal 15, and output signal 44.

The logic gate 35 inputs the AS signal 12 and the HIT signal 18, and outputs an output signal 45.

The logic gate 37 inputs the AS signal 12 and the HIT signal 18, and outputs an output signal 46.

The delay circuit 40 inputs the output signal 46 of the logic gate 37 and the clock signal 15, and outputs an output signal 47.

The FF 41 inputs the output signal 45 of the logic gate 35 to the set terminal S and the DS signal 13 to the reset terminal R, and outputs an output signal 48 from the output terminal #Q.

The logic gate 36 inputs the output signal 44 of the delay circuit 39 and the output signal 48 of the FF 41, and outputs an output signal 49.

The FF 42 inputs the output signal 47 of the delay circuit 40 to the set terminal S and the DS signal 13 to the reset terminal R, and outputs and output signal 50 from the output terminal #Q.

The CFF 43 inputs the output signal 49 of the logic gate 36 to the set terminal S, the DS signal 13 to the reset terminal R and the clock signal 15 to a clock terminal, and outputs an output signal 51 from the output terminal #Q.

The logic gate 38 inputs the output signal 51 of the CFF 43 and the output signal 50 of the FF 42 and outputs the DC signal 14.

FIG. 9A is a schematic view showing an example of arrangement of instructions in the first memory bank 2A, wherein a 10th instruction IN10 is to be arranged in an address "100", a 12th instruction IN12 in an address "101", a 14th instruction IN14 in an address "110", a 20th instruction IN20 in an address "10000" and a 22nd instruction in an address "10001".

FIG. 9B is a schematic view showing an example of arrangement of instructions in the second memory bank 2B, wherein an 11th instruction IN11 is to be arranged in an address "100", a 13th instruction IN13 in an address "101", a 15th instruction in an address "110", a 21st instruction IN21 in an address "10000" and a 23rd instruction IN23 in an address "10001".

When comparing FIG. 9A and FIG. 9B with FIG. 3 showing the aforementioned conventional example, the 10th instruction IN 10, 12th instruction IN12, 14th instruction IN14 . . . 20th instruction IN20 and 22nd instruction IN22 which were conventionally stored in the addresses "1000", "1010", "1100" . . . "100000" and "100010" whose least significant bits are "0", are respectively stored in the addresses "100", "101", "110" . . . "10000" and "10001" of the first memory bank 2A. Also, the 11th instruction IN11, 13th instruction IN13, 15th instruction IN15 . . . 21st instruction IN21 and 23rd instruction IN23 which were conventionally stored in the addresses "1001", "1011", "1101" . . . "100001" and "100011" whose least significant bits are "1", are stored respectively in the addresses "100", "101", "110" . . . "10000" and "10001" in the second memory bank 2B.

Thus, by storing the respective data (in this case, the instructions) with addresses in the two memory banks 2A and 2B as shown in FIG. 9A and FIG. 9B, the data (in this case, the 10th instruction IN10, 12th instruction IN12, 14th instruction IN14 . . . 20th instruction IN20 and 22nd instruction IN22) in the addresses (the addresses shown in FIG. 3) viewed from the microprocessor core 5, whose least significant bits are "0" (even addresses) are arranged in the first memory area 2A, and the data (in this case, the 11th instruction IN11, 13th instruction IN13 15th instruction IN15 . . . 21st instruction IN21 and 23rd instruction IN23) in the addresses viewed from the microprocessor core 5, whose least significant bits are "1" (odd addresses) are arranged in the second memory bank 2B.

Such an arrangement state of the instructions, when viewed from the microprocessor core 5, becomes equivalent with an example of instruction arrangement in the external memory 98 of the conventional example shown in FIG. 3.

In other words, the addresses viewed from the microprocessor core 5 of the respective data (in this case, the instructions) stored in the memory banks 2A and 2B are the values adding bits "0" to the lower side of the least significant bits of the addresses storing the data in the first memory bank 2A, and the values adding bits "1" to the lower side of the least significant bits of the addresses storing the data in the second memory bank 2B.

The data (in this case, the instructions) whose least significant bits of the addresses viewed from the microprocessor core 5 are "0" (even address) are arranged in the addresses of the first memory bank 2A similar to the values other than the least significant bits of the addresses. The data (in this case, the instructions) whose least significant bits of the addresses viewed from the microprocessor core 5 are "1" (odd address) are arranged in the addresses of the second memory bank 2B similar to the values other than the least significant bits of the addresses.

Next, the operation of the microprocessor of the present invention having the configuration as described above and the data processor using the same is described.

However, in the following description, the HIT signal 18, the count signal 19, the load signal 20 and the PA signal 21 ar all assumed to be negative logics.

At first, the operation of the address counter 6, the address latch 7, the address comparator 8 and the bank selector 3 in the microprocessor 1 of the first invention shown in FIG. 6 is described.

The address counter 6 is controlled by the count signal 19 and the load signal 20 given from the control circuit 9. Specifically, the address counter 6 adds "1" to its own stored content at a time point of falling of the count signal 19, and fetches and stores a value of the address bus 10B other than the least significant bit 10A of the address bus 10 at a time point of falling of the load signal 20. The address counter 6 always outputs its own stored content to the output bus 16.

The address latch 7, at a time point of rising of the PA signal 21, fetches the stored content of the address counter 6 via the output bus 16 for storage. The address latch 7 always outputs its own stored content to the pre-output address bus 17.

The address comparator 8 compares, at a time point of falling of the AS signal 12, the value of the address bus 10B other than the address bus 10A of the address bus 10 and a value of the pre-output address bus 17, and makes the HIT signal 18 be a L level when they coincide with each other, and be a H level when they do not coincide. The address comparator 8 makes the HIT signal 18 be in the H level at a time point of rising of the AS signal 12.

The bank selector 3 outputs the data on the output bus 22A of the first memory bank 2A to the data bus 11 when the least significant bit 10A of the address bus 10 is in the L level, and outputs the data on the output bus 22B of the second memory bank 2B to the data bus 11 when it is in the H level.

Next, the operation of the control circuit 9 in the microprocessor 1 of the first invention of the present invention whose configuration is particularly shown in FIG. 7 is described.

The logic gate 23 makes the output signal 30 be in the H level, when the condition is realized such that, the AS signal 12 is in the L level, the HIT signal 18 is in the L level and the clock signal 15 is in the H level, and makes the output signal 30 be in the L level when the above-mentioned condition is not realized.

The logic gate 24 makes the output signal 31 be in the L level, when the condition is realized such that, the AS signal 12 is in the L level and the HIT signal 18 is in the H level, and makes the output signal 31 be in the H level when the above-mentioned condition is not realized.

Content of 3 bits in the shift register 29 are all in the H level at an initial state. At every rising of the clock signal 15, the shift register 29 dumps the content of the third bit, shifts the content of the second bit to the third bit, shifts the content of the first bit to the second bit, and fetches a value of the output signal 31 of the logic gate 24 into the first bit. The shift register 29 always outputs the content of the first bit as the load signal 20 and the content of the third bit as the output signal 32.

Thus, the load signal 20 changes to the L level from the H level at a time point of rising of the clock signal 15 first from the case where the output signal 31 of the logic gate 24 is in the L level, and the output signal 32 changes to the L level from the H level at a third time point of rising of the clock signal 15.

When the output signal 31 of the logic gate 24 returns to the H level in such a manner, at the time point of rising of the clock signal 15 first from a time point at which the output signal 31 of the logic gate 24 returns to the H level, the load signal 20 returns to the H level from the L level, and the output signal 32 returns to the H level from the L level at the third time point of rising of the clock signal 15.

The logic gate 25 makes the output signal 33 be in the H level when the condition is realized such that, the output signal 30 of the logic gate 23 is in the H level or the output signal 32 of the shift register 29 is in the L level, and makes the output signal 33 be in the L level when the above-mentioned condition is not realized.

The FF 28 is set at a time point of rising of the output signal 33 of the logic gate 25 to make the output signal 34 be in the L level, and is reset at a time point of rising of the DC signal 14 to return the output signal 34 to the H level.

The logic gate 26 makes the count signal 19 be in the L level when the condition is realized such that, the output signal 34 of the FF 28 is in the L level and the least significant bit 10A of the address bus 10 is in the H level, and makes the count signal 19 be in the H level when the above-mentioned condition is not realized.

The logic gate 27 makes the PA signal 21 be in the L level when the condition is realized such that, the count signal 19 is in the L level or the load signal 20 is in the L level, and makes the PA signal 21 be in the H level when the above-mentioned condition is not realized.

Thus, a time point at which the count signal 19 changes to the L level from the H level is the following two time points. One is the time point of rising of the clock signal 15 when the condition is realized such that, the least significant bit 10A of the address bus 10 is the H level and the HIT signal 18 is in the L level. The other is the third time point of rising of the clock signal 15 counted from and including the time point of rising of the clock signal 15 when the condition is realized such that, the least significant bit 10A of the address bus 10 is in the H level, the AS signal 12 is in the L level and the HIT signal 18 is in the H level, including the rising.

The count signal 19 returns to the H level from the L level at the time point of rising of the DC signal 14.

A time point at which the load signal 20 changes to the L level from the H level is the time point of rising of the clock signal 15 when the condition is realized such that, the AS signal 12 is in the L level and the HIT signal 18 is in the H level. The load signal 20 returns to the H level from the L level at the next time point of rising of the clock signal 15.

The PA signal 21 is in the H level only when both the count signal 19 and the load signal 20 are in the H level, and changes to the L level when either the count signal 19 or the load signal 20 is in the L level.

Next, the operation of the response circuit 4 whose configuration is particularly shown in FIG. 8 is described.

The delay circuit 39 makes the output signal 44 be in the L level from the H level at the time point of rising of the PA signal 21, and starts to count the number of times of falling of the clock signal 15, and at a third time point of falling of the clock signal 15, returns the output signal 44 to the H level from the L level. Also, the delay circuit 39, when there is the rising of the PA signal 21 when its own output signal 44 is in the L level, resets the count number and starts to count again newly from that time point. This count number is dependent on the access time of the memory 2 and the frequency of the clock signal 15. The count number "3" is an example of set value, when the access time of the memory 2 is 120 ns and the frequency of the clock signal 15 is 20 Mhz.

The L level of the output signal 44 of the delay circuit 39 means that accessing to the memory 2 is executing, in other words, valid data is not outputted from the memory 2.

The logic gate 35 makes the output signal 45 be in the H level when the condition is realized such that, the AS signal 12 is in the L level and the HIT signal 18 is in the L level, and makes the output signal 45 be in the L level when the above-mentioned condition is not realized.

The FF 41 is set to make the output signal 48 be in the L level when the output signal 45 of the logic gate 35 is in the H level, and is reset to return the output signal 48 to the H level at the time point of rising of the DS signal 13.

The logic gate 36 makes the output signal 49 be in the H level when the condition realized such that, the output signal 44 of the delay circuit 39 is in the H level and the output signal 48 of the FF 41 is in the L level, and makes the output signal 49 be in the L level when the above-mentioned condition is not realized.

The CFF 43 is set at the time point of rising of the clock signal 15 when the output signal 49 of the logic gate 36 is in the H level to make the output signal 51 be in the L level, and is reset at the time point of rising of the DS signal 13 to return the output signal 51 to the H level.

The logic gate 37 makes the output signal 46 be in the L level when the condition is realized such that, the AS signal 12 is in the L level and the HIT signal 18 is in the H level, and makes the output signal 46 be in the H level when the above-mentioned condition is not realized.

The delay circuit 40 starts to count the number of times of rising of the clock signal 15 when the output signal 46 of the logic gate 37 becomes in the L level, makes the output signal 47 be in the H level at the time point of rising of the clock signal 15 when a count number becomes "5", and returns it to the L level at the next time point of falling of the clock signal 15. The above-mentioned count number is dependent on the access time of the memory 2 and the frequency of the clock signal 15. The counter number "5" is an example of set value when the access time of the memory 2 is 120 ns and the frequency of the clock signal 15 is 20 Mhz.

The FF 42 is set to make the output signal 50 be in the L level when the output signal 47 of the delay circuit 40 becomes in the H level, and is reset to return the output signal 50 to the H level at the time point of rising of the DS signal 13.

The logic gate 38 makes the DC signal 14 be in the L level when the condition is realized such that, the output signal 51 of the CFF 43 is in the L level or the output signal 50 of the FF 42 is in the L level, and makes the DC signal 14 be in the L level when the above-mentioned condition is not realized. Thus, a time point at which the DC signal 14 changes to the L level from the H level is the following two time points. One is the time point at which the output signal 44 of the delay circuit 39 is in the H level as a result of checking a value of the output signal 44 of the delay circuit 39 at every rising of the clock signal 15 from and including the time point of rising of the clock signal 15 when the condition is realized such that, the AS signal 12 is in the L level and the HIT signal 18 is in the L level. The other is the fifth time point of rising of the clock signal 15 counted form and including the time point of rising of the clock signal 15 when the condition is realized such that, the AS signal 12 is in the L level and the HIT signal 18 is in the H level. The DC signal 14 returns to the H level from the L level at the time point of rising of the DS signal 13.

In the following, the operation of the microprocessor of the first invention of the present invention and the data processor using the same is described with reference to timing charts of FIG. 10, FIG. 11, FIG. 12 and FIG. 13 showing the states of respective signal at the time of operation.

For convenience of sake of the description, the microprocessor core 5 is to read one instruction in one bus cycle, and as shown in FIG. 10, FIG. 11, FIG. 12 and FIG. 13, respective cycles of the clock signal 15 are numbered.

In the following description, a rising of the clock signal 15 of cycle n is defined as a transition point to the H level of the clock signal 15 of cycle n from the L level of the clock signal 15 of cycle n-1, in other words, rising.

FIG. 10 is a timing chart for explaining an example of operation to read instruction from the memory 2 by the microprocessor 1 of the first invention of the present invention.

In the timing chart of FIG. 10, the operation of reading sequential instructions, specifically, the operation of reading an 11th instruction IN11 in an address "1001", a 12th instruction IN12 in an address "1010", a 13th instruction IN13 in an address "1011" and a 14th instruction IN14 in an address "1100" in order, when the access time (a time till valid data is outputted after assertion of the address) of both the memory banks 2A and 2B of the memory 2 is a relatively long 120 ns and the frequency of the clock signal 15 is 20 MHz (a cycle is 50 ns) is shown.

The above-mentioned addresses are those viewed from the microprocessor core 5.

The 11th instruction IN11 in the address "1001" is read from a cycle 1 of the clock signal 15 shown in FIG. 10.

Assume that the content of the address counter 6 becomes "100" and the content of the address latch 7 and a value of the pre-output address bus 17 become "100" by the operation before cycle 1, and the 10th instruction IN10 is to be outputted to the output bus 22A of the first memory bank 2A as data, and the 11th instruction IN11 is to be outputted to the data bus 22B of the second memory bank 2B as data.

The count signal 19, the load signal 20, the PA signal 21, the HIT signal 18 and the output signal 44 of the delay circuit 39 are to be in the H level by the operation before the cycle 1.

At first, at the time point of rising of the clock signal 15 of cycle 1, the address "1001" is outputted to the address bus 10 from the microprocessor core 5. Thus, the least significant bit 10A of the address bus 10 is in the H level ("1"), and the address bus 10B other than the least significant bit 10A of the address bus 10 becomes "100".

Since the least significant bit 10A of the address bus 10 is in the H level, the bank selector 3 outputs data (in this case, the 11th instruction IN11) on the output bus 22B of the second memory bank 2B to the data bus 11.

At the time point of falling of the clock signal 15 of cycle 1, the microprocessor core 5 makes the AS signal 12 be in the L level, and indicates to the control circuit 9 and response circuit 4 that the microprocessor core 5 has outputted the valid address. As the AS signal 12 is in the L level, the address comparator 8 compares the value "100" of the address bus 10B other than the least significant bit 10A of the address bus 10 and the value "100" of the pre-output address bus 17. Since they coincide with each other in this case, the address comparator 8 makes the HIT signal 18 be in the L level.

At the time point of rising of the clock signal 15 of cycle 2, the microprocessor core 5 makes the DS signal 13 be in the L level and indicates to the response circuit 4 that data is being read. Since the rising of the clock signal 15 of cycle 2 is the rising of the clock signal 15 when the aforementioned condition is realized such that, the least significant bit 10A of the address bus 10 is in the H level, the AS signal 12 is in the L level and the HIT signal 18 is in the L level, the control circuit 9 makes the count signal 19 be in the L level from the H level and makes the PA signal 21 also be in the L level from the H level.

Simultaneously, since the count signal 19 changes to the L level from the H level, the address counter 6 adds "1" to its own stored content "100" to make it "101".

At the time point of falling of the clock signal 15 of cycle 2, the microprocessor core 5 returns the AS signal 12 to the H level, and the address comparator 8 returns the HIT signal 18 to the H level.

The response circuit 4 checks a value of the output signal 44 of the delay circuit 39 at every rising of the clock signal 15 from a time point at which the condition is realized such that, the AS signal 12 is in the L level and the HIT signal 18 is in the L level, and at a time point at which the output signal 44 of the delay circuit 39 is in the H level (the time point of rising of the clock signal 15 of cycle 2), makes the DC signal 14 be in the L level and indicates to the microprocessor core 5 that valid data (in this case, the 11th instruction IN11) is outputted on the data bus 11.

When detecting that the DC signal 14 is in the L level, the microprocessor core 5 reads the data in this case, the 11th instruction IN11) on the data bus 11, and at the next time point of rising of the clock signal 15 (a time point of rising of the clock signal 15 of cycle 3), returns the DS signal 13 to the H level and indicates to the response circuit 4 that the data has been read.

At this time point of rising of the DS signal 13, the response circuit 4 returns the DC signal 14 to the H level.

At the time point of rising of the DC signal 14, the control circuit 9 returns the count signal 19 as well as the PA signal 21 to the H level.

At the time point of rising of the PA signal 21, the address latch 7 latches the content "101" of the address counter 6 via the output bus 16 of the address counter 6. Thus, a value of the pre-output address bus 17 becomes "101".

In two cycles from the cycle 1 to the cycle 2, the reading of the 11th instruction IN11 in the address "1001" is completed.

Next, the 12th instruction IN12 in the address "1010" is read from a cycle 3.

At a time point of rising of the clock signal 15 of cycle 3, the address "1010" is outputted to the address bus 10 from the microprocessor core 5. Thus, the least significant bit 10A of the address bus 10 is in the L level ("0"), and the address bus 10B other than the least significant bit 10A of the address bus 10 becomes "101".

Since the least significant bit 10A of the address bus 10 becomes in the L level, the bank selector 3 outputs the data on the output bus 22A of the first memory bank 2A to the data bus 11. However, since valid data is still not outputted to the output bus 22A of the first memory bank 2A, the valid data is not outputted to the data bus 11.

At the time point of falling of the clock signal 15 of cycle 3, the microprocessor core 5 makes the AS signal 12 be in the L level and indicates to the control circuit 9 and the response circuit 4 that a valid address has been outputted. Since the AS signal 12 is in the L level, the address comparator 8 compares the value "101" of the address bus 10B other than the least significant bit 10A of the address bus 10 and the value "101" of the pre-output address bus 17. Since they coincide with each other in this case, the address comparator 8 makes the HIT signal 18 be in the L level.

At a time point of rising of the clock signal 15 of cycle 4, the microprocessor core 5 makes the DS signal 13 be in the L level and indicates to the response circuit 4 that data is being read.

At the time point of falling of the clock signal 15 of cycle 2, the microprocessor core 5 returns the AS signal 12 to the H level, and the address comparator 8 returns the HIT signal 18 to the H level.

After 120 ns from a time point at which the value of the pre-output address bus 17 becomes "101" (during the clock signal 15 of cycle 5 is in the L level), valid data (in this case, the 12th instruction IN12) is outputted to the output bus 22A from the first memory bank 2A, and valid data (in this case, the 13th instruction IN13) is outputted to the output bus 22B from the second memory bank 2B.

The data (in this case, the 12th instruction IN12) on the output bus 22A of the first memory bank 2A is outputted to the data bus 11 by the bank selector 3.

In the response circuit 4, at the time point of rising of the PA signal 21 (the time point of rising of the clock signal 15 of cycle 3), the output signal 44 of the delay circuit 39 becomes in the L level, and at the time point of falling of the clock signal 15 of cycle 5, the output signal 44 of the delay circuit 39 becomes in the H level. The response circuit 4 checks a value of the output signal 44 of the delay circuit 39 at every risings of the clock signal 15 from the time point at which the condition is realized such that, the AS signal 12 is in the L level and the HIT signal 18 is in the L level, and makes the DC signal 14 be in the L level at the time point at which the output signal 44 of the delay circuit 39 is in the H level (a time point of rising of the clock signal of cycle 6), and indicates to the microprocessor core 5 that the valid data (in this case, the 12th instruction IN12) is outputted on the data bus 11.

The rising of the clock signal 15 of cycle 6 corresponds to the first rising of the clock signal 15 from the assertion of output of data (in this case, the 12th instruction IN12) from the first memory bank 2A on the data bus 11.

When detecting that the DC signal 14 becomes in the L level, the microprocessor core 5 reads the data (in this case, the 12th instruction IN12) on the data bus 11, and at the next time point of rising of the clock signal 15 (a time point of rising of the clock signal 15 of cycle 7), returns the DS signal 13 to the H level and indicates that the data has been read.

At the time point of rising of the DS signal 13, the response circuit 4 returns the DC signal 14 to the H level.

In four cycles from the cycle 3 to the cycle 6, the reading of the 12th instruction IN12 in the address "1010" is completed.

Hereinafter, the microprocessor core 5 outputs the address "1011" in two cycles from the cycle 7 to the cycle 8, and reads the 13th instruction IN13 in the address "1011" by the same operation as in two cycles from the cycle 1 to the cycle 2, and outputs the address "1100" in four cycles from the cycle 9 to the cycle 12 and reads the 14th instruction IN14 in the address "1100" by the same operation as in four cycles from the cycle 3 to the cycle 6.

Figure 11:
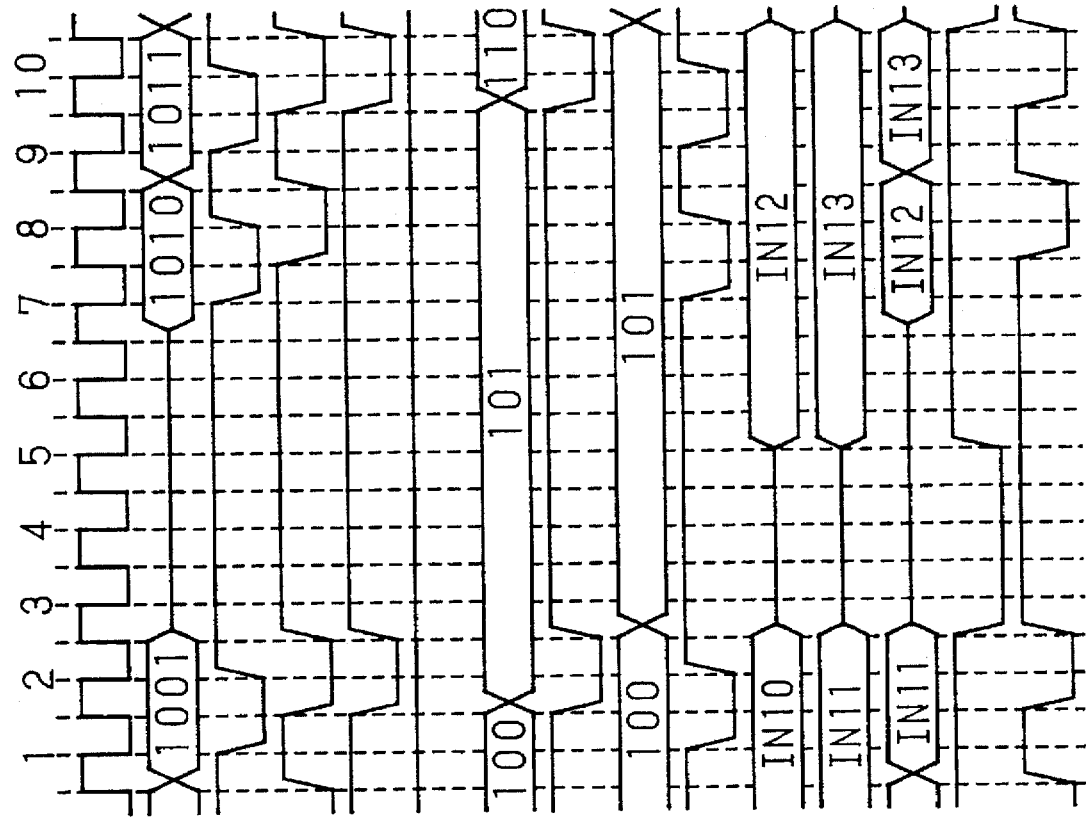
FIG. 11 is a timing chart for explaining another operation example for reading instructions from a memory by a microprocessor of a first invention of the present invention.

FIG. 11 is a timing chart for explaining another example of operation to read instruction from the memory 2 by the microprocessor 1 of the first invention of the present invention.

In this timing chart of FIG. 11, though the operation of reading the 11th instruction IN11 in the address "1001", 12th instruction IN12 in the address "1010" and 13th instruction IN13 in the address "1011" in order, when the access time of the memory banks 2A and 2B of the memory 2 is a relatively long 120 ns and the frequency of the clock signal 15 is 20 MHz is shown, the case where a period of not activating an instruction read bus cycle exists between the reading of the 11th instruct, ion IN11 and the reading of the 12th instruction IN12 is shown.

Where, the above-mentioned addresses are those viewed from the microprocessor core 5.

The operation before the cycle 1 is to be similar to the example of operation shown in the timing chart of FIG. 10.

In two cycles from the cycle 1 to the cycle 2, the microprocessor 1 reads the 11th instruction IN11 int he address "1001" by the same operation as in two cycles from the cycle 1 to the cycle 2 in the timing chart of FIG. 10.

In four cycles from the cycle 3 to the cycle 6, the microprocessor 1 doers not activate the instruction read bus cycle, and reads the 12th instruction IN12 int he address "1010" from a cycle 7.

Since the value of the pre-output address bus 17 changes to "101" from "100" at the time point of rising of the clock signal 15 of cycle 3, after 120 ns from the time point at which the value of the pre-output address bus 17 becomes "101" (during the clock signal 15 of cycle 5 is in the L level), the valid data (in this case, the 12th instruction IN12) is outputted to the output bus 22A from the first memory bank 2A, and the valid data (in this case, the 13th instruction IN13) is outputted to the output bus 22B from the second memory bank 2B. Since the PA signal 21 changes to the H level from the L level at the time point of rising of the clock signal 15 of cycle 3, the output signal 44 of the delay circuit 39 becomes in the L level in the response circuit 4, and the output signal 44 of the delay circuit 39 returns to the H level at a time point of falling of the clock signal 15 of cycle 5.

At time point of rising of the clock signal 15 of cycle 7, the address "1010" is outputted to the address bus 10 from the microprocessor core 5. Thus, the least significant bit 10A of the address bus 10 is in the L level and the address bus 10B other than the least significant bit 10A of the address bus 10 becomes "101".

Since the least significant bit 10A of the address bus 10 becomes in the L level, the bank selector 3 outputs the data (in this case, the 12th instruction IN12) on the output bus 22A of the first memory bank 2A to the data bus 11.

At the time point of falling of the clock signal 15 of cycle 7, the microprocessor core 5 makes the AS signal 12 be in the L level and indicates to the control circuit 9 and the response circuit 4 that the valid address is outputted. Since the AS signal 12 becomes in the L level, the address comparator 8 compares the value "101" of the address bus 10B other than the least significant bit 10A of the address bus 10 and the value "101" of the pre-output address bus 17. Since they coincide with each other in this case, the address comparator 8 makes the HIT signal 18 be in the L level.

At a time point of rising of the clock signal 15 of cycle 8, the microprocessor core 5 makes the DS signal 13 be in the L level and indicates to the response circuit 4 that data is being read.

A the time point of falling of the clock signal 15 of cycle 8, the microprocessor core 5 returns the AS signal 12 to the H level, and the address comparator 8 returns the HIT signal 18 to the HIT level.

The response circuit 4 checks the value of the output signal 44 of the delay signal 30 at every risings of the clock signal 15, from the time point at which the aforementioned condition is realized such that, the AS signal 12 is in the L level and the HIT signal 18 is in the L level, and the time point at which the output signal 44 of the delay circuit 39 is in the H level (the time point of rising of the clock signal 15 of cycle 8), makes the DC signal 14 be in the L level and indicates to the microprocessor core 5 that the valid data (in this case, the 12th instruction IN12) is outputted on the data bus 11.

The rising of the clock signal 15 of cycle 8 corresponds to the first rising of the clock signal 15 from the assertion of output of data (in this case, the 12th instruction IN12) from the first memory bank 2A to the data bus 11. When detecting that the DC signal 14 becomes in the L level, the microprocessor core 5 reads the data (in this case, the 12th instruction IN12) on the data bus 11, and at the next time point of rising of the clock signal 15 (a time point of rising of the clock signal 15 of cycle 9), returns the DS signal 13 to the H level and indicates to the response circuit 4 that the data has been read.

At the time point of rising of the DS signal 13, the response circuit 4 returns the DC signal 14 to the H level.

In two cycles from the cycle 7 to the cycle 8, the reading of the 12th instruction IN12 in the address "1010" is completed.

Hereinafter, the microprocessor core 5 outputs the address "1011" in two cycles from the cycle 9 to the cycle 10, and reads the 13th instruction IN13 in the address "1011" by the same operation as in two cycles from the cycle 7 to the cycle 8 in the timing chart of FIG. 10.

Figure 12:
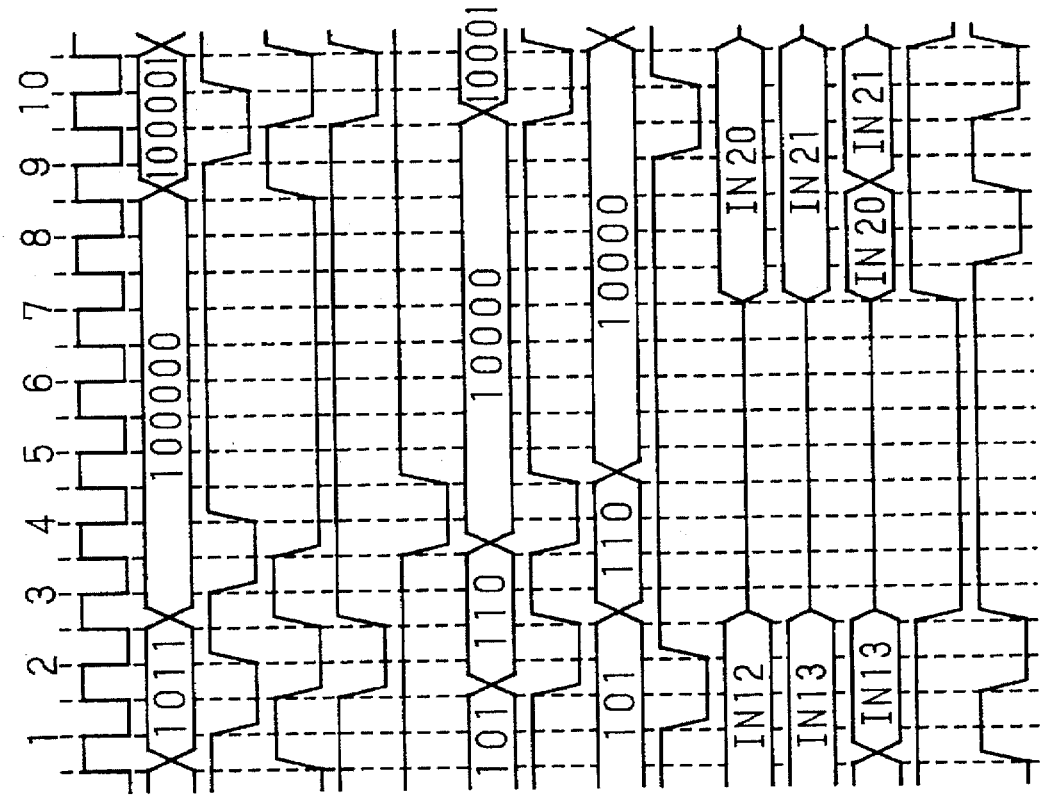
FIG. 12 is a timing chart for explaining still another operation example for reading instructions from a memory by a microprocessor of a first invention of the present invention.

FIG. 12 is a timing chart for explaining still another example of the operation to read instruction from the memory 2 by the microprocessor 1 of the first invention of the present invention.

In this timing chart of FIG. 12, the operation of reading non-sequential instructions, specifically, the operation of reading the 13th instruction IN13 in the address "1011", 20th instruction IN20 in the address "100000" and 21st instruction IN21 in the address "100001" in order, when the access time of the memory banks 2A and 2B of the memory 2 is relatively long 120 ns and the frequency of the clock signal is 20 MHz is shown. The above-mentioned addresses are those viewed from the microprocessor core 5.

In two cycles from the cycle 1 to the cycle 2, the microprocessor 1 reads the 13th instruction IN13 in the address "1011" by the same operation as in two cycles from the cycle 7 to the cycle 8 in the timing chart of FIG. 10. The microprocessor 1 reads the 20th instruction IN20 in the address "100000" from the cycle 3.

At the timing point of rising of the clock signal 15 of cycle 3, the address "100000" is outputted to the address bus 10 from the microprocessor core 5. Thus, the least significant bit 10A of the address bus 10 becomes in the L level, and the address bus 10B other than the least significant bit 10A of the address bus 10 becomes "10000".

Since the least significant bit 10A of the address bus 10 becomes in the L level, the bank selector 3 outputs data on the output bus 22A of the first memory bank 2A to the data bus 11. However, since valid data is still not outputted to the output bus 22A of the first memory bank 2A, the valid data is not outputted to the data bus 11.

At the time point of falling of the clock signal 15 of cycle 3, the microprocessor core 5 makes the AS signal 12 be in the L level and indicates to the response circuit 4 and the control circuit 9 that the valid address has been outputted.

Since the AS signal 12 becomes in the L level, the address comparator 8 compares the value "10000" of the address bus 10B other than the least significant bit 10A of the address bus 10 and the value "110" of the pre-output address bus 17. Since they do not coincide with each other in this case, the address comparator 8 keeps the HIT signal 18 in the H level without change.

At the time point of rising of the clock signal 15 of cycle 4, the microprocessor core 5 makes the DS signal 13 be in the L level and indicates to the response circuit 4 that data is being read. Since the rising of the clock signal 5 of cycle 4 corresponds to the rising of the clock signal 15 when the aforementioned condition is realized such that, the AS signal 12 is in the L level and the HIT signal 18 is in the H level, the control circuit 9 makes the load signal 20 be in the L level from the H level and also the PA signal 21 to the L level from the H level. Since the load signal 20 changes to the L level from the H level, the address counter 6 fetches and stores the value "10000" of the address bus 10B other than the least significant bit 10A of the address bus 10.

The microprocessor core 5 returns the AS signal 12 to the H level at a time point of falling of the clock signal 15 of cycle 4.

At the time point of rising of the clock signal 15 of cycle 5, the control circuit 9 returns the load signal 20 to the H level and also the PA signal 21 to the H level. At the time point of rising of the PA signal 21, the address latch 7 latches the content "10000" of the address counter 6 via the output bus 16 of the address counter 6. Thus, the value of the pre-output address bus 17 becomes "10000".

Since the value of the pre-output address bus 17 changes to "10000" after 120 ns from the time point at which the value of the pre-address bus 17 becomes "110" (during clock signal 15 of cycle 5 is in the L level), valid data (in this case, the 14th instruction IN14) is not outputted to the output bus 22A from the first memory bank 2A, and valid data (in this case, the 15th instruction IN15) is not outputted to the output bus 22B from the second memory bank 2B. After 120 ns from the time point at which the value of the pre-output address bus 17 becomes "10000" (during the clock signal 15 of cycle 7 is in the L level), valid data (in this case, the 20th instruction IN20) is outputted to the output bus 22A from the first memory bank 2A, and valid data (in this case, the 21st instruction IN21) is outputted to the output bus 22B from the second memory bank 2B.

Data (in this case, the 20th instruction IN20) on the output bus 22A of the first memory bank 2A is outputted to the data bus 11 by the bank selector 3. The response circuit 4 counts the number of times of rising of the clocks signal 15 from the time point of rising of the clock signal 15 at which the aforementioned condition is realized such that, the AS signal 12 is in t e L level and the HIT signal 18 is in the H level, and at the time point of rising of the clock signal 15 at which "5" is counted (a time point of rising of the clock signal 15 of cycle 8), makes the DC signal 14 be in the L level and indicates to the microprocessor core 5 that the valid data (in this case, the 20th instruction IN20) is outputted to the data bus 11.

The rising of the clock signal 15 of cycle 8 corresponds to the first rising of the clock signal 15 from the time point of assertion of data (in this case, the 20th instruction IN20) of output to the data bus 11 from the first memory bank 2A.

When detecting that the DC signal 14 becomes in the L level, the microprocessor core 5 reads the data (in this case, the 20th instruction IN20) on the data bus 11, and at the next time point of rising of the clock signal 15 (a time point of rising of the clock signal 15 of cycle 9), returns the DS signal 13 to the H level and indicates to the response circuit 4 that the data has been read.

The response circuit 4 returns the DC signal 14 to the H level at the time point of rising of the DS signal 13.

In six cycles from the cycle 3 to the cycle 8, the reading of the 20th instruction IN20 in the address "100000" is completed.

Hereinafter, the microprocessor core 5 outputs the address "100001" in two cycles from the cycle 9 to the cycle 10, and reads the 21st instruction IN21 in the address "100001" by the same operation as in two cycles from the cycle 1 to the cycle 2 in the timing chart of FIG. 10.

Figure 13:
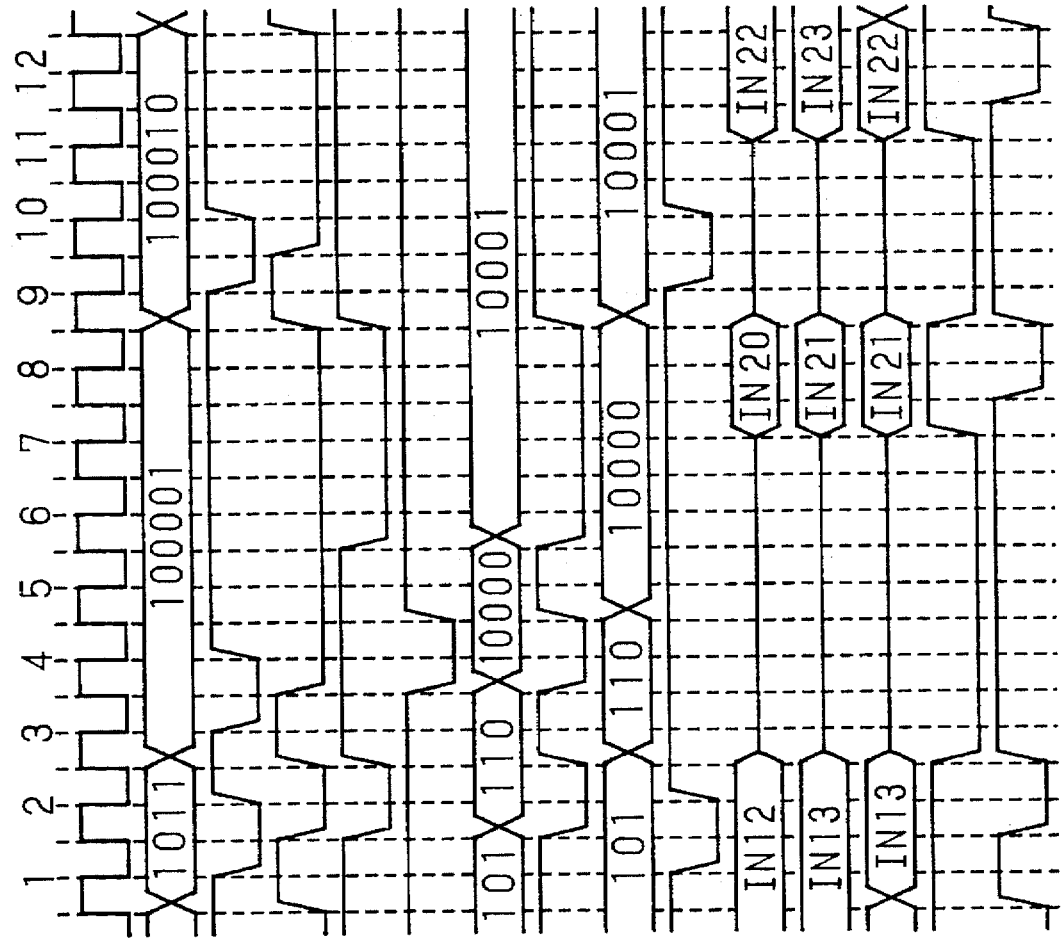
FIG. 13 is a timing chart for explaining a further operation example for reading instructions from a memory by a microprocessor of a first invention of the present invention.

FIG. 13 is a timing chart for explaining a further example of operation to read instructions from the memory 2 by the microprocessor 1 of the first invention of the present invention.

In this timing chart of FIG. 13, the operation of reading non-sequential instructions, specifically, the operation of reading the 13th instruction IN13 in the address "1011", 21st instruction IN21 in the address "100001" and 22nd instruction IN22 in the address "100010", when the access time of the memory banks 2A and 2B of the memory 2 is a relatively long 120 ns and the frequency of the clock signal 15 is 20 MHz is shown. The above-mentioned addresses are those viewed from the microprocessor core 5.

In two cycles from the cycle 1 to the cycle 2, the microprocessor 1 reads the 13th instruction IN13 in the address "1011" by the same operation as in two cycles from the cycle 7 to the cycle 8 in the timing chart of FIG. 10.

The microprocessor 1 reads the 21st instruction IN21 in the address "100000" from the cycle 3. At the timing point of rising of the clock signal 15 of cycle 3, the address "100001 is outputted to the address bus 10 from the microprocessor core 5. Thus, the least significant bit 10A of the address bus 10 becomes in the L level, and the address bus 10B other than the least significant bit 10A of the address bus 10 becomes "10000".

Since the least significant bit 10A of the address bus 10 becomes in the L level, the bank selector 3 outputs data on the output bus 22A of the first memory bank 2A to the data bus 11. However, since valid data is still not outputted to the output bus 22A of the first memory bank 2A, the valid data is not outputted to the data bus 11.

At the time point of falling of the clock signal 15 of cycle 3, the microprocessor core 5 makes the AS signal 12 be in the L level and indicates to the control circuit 9 and the response circuit 4 that valid address has been outputted. Since the AS signal 12 becomes in the L level, the address comparator 8 the value "10000" of the address bus 10B other than the least significant bit 10A of the address bus 10 and the value "110" of the pre-output address bus 17. Since they do not coincide with each other in this case, the address comparator 8 keeps the HIT signal 18 in the H level without change.

At the time point of rising of the clock signal 15 of cycle 4, the microprocessor core 5 makes the DS signal 13 be in the L level and indicates to the response circuit 4 that data is being read. Since, the rising of the clock signal 15 of cycle 4 corresponds to the rising of the clock signal 15 when the aforementioned condition is realized such that, the AS signal 12 is in the L level and the HIT signal 18 is in the H level, the control circuit 9 makes the load signal 20 as well as the PA signal 21 be in the L level from the H level.

Since the load signal 20 changes to the L level from the H level, the address counter 6 fetches and stores the value "10000" of the address bus 10B other than the least significant bit 10A of the address bus 10. The microprocessor core 5 returns the AS signal 12 to the H level at the time point of falling of the clock signal 15 of cycle 4.

At the time point of rising of the clock signal 15 of cycle 5, the control circuit 9 returns the load signal 20 as well as the PA signal 21 to the H level. At the time point of rising of the PA signal 21, the address latch 7 latches the content "10000" of the address counter 6 via the output bus 16 of the address counter 6. Thus, a value of the pre-output address bus 17 becomes "10000".

Since the time point of rising of the clock signal 15 of cycle 6 corresponds to the third time point of rising counted from and including the time point of rising of the clock signal 15 when the aforementioned condition is realized such that, the least significant bit 10A of the address bus 10 is in the H level, the AS signal 12 is in the L level and the HIT signal 18 is in the H level, the control circuit 9 makes the count signal 19 as well as the PA signal 21 be in the L level from the H level. Since the count signal 19 changes to L level from the H level, the address counter 6 adds "1" to the stored content "10000" to make it "100001".

Since the value of the pre-output address bus 17 changes to "10000" after 120 ns from a time point at which the value of the pre-output address bus 17 becomes "110" (during the clock signal 15 of cycle 5 is in the L level), data (in this case, the 14th instruction IN14) is not outputted to the output bus 22A from the first memory bank 2A, and also data (in this case, the 15th instruction IN15) is not outputted to the output bus 22B from the memory bank 2B.

After 120 ns from the time point at which the value of the pre-output address bus 17 becomes "10000" (during the clock signal 15 of cycle 7 is in the L level), the valid data (in this case, the 20th instruction IN20) is outputted to the output bus 22A from the first memory bank 2A and the valid data (in this case, the 21st instruction IN21) is outputted to the output bus 22B from the second memory bank 2B.

The data (in this case, the 21st instruction IN21) on the data bus 22B of the second memory bank 2B is outputted to the data bus 11 by the bank selector 3. The response circuit 4 counts the number of times of rising of the clock signal 15 from the time point of rising of the clock signal 15 when the aforementioned condition is realized such that, the AS signal 12 is in the L level and the HIT signal 18 is in the H level, and at the time point of rising of the clock signal 15 at which "5" is counted (the time point of rising of the clock signal 15 of cycle 8), makes the DC signal 14 be in the L level and indicates to the microprocessor core 5 that the valid data (in this case, the 21st instruction IN21) is outputted to the data bus 11.

The rising of the clock signal 15 of cycle 8 corresponds to the first rising of the clock signal 15 from the time point of assertion of data (in this case, the 21st instruction IN21) of output to the data bus 11 from the first memory bank 2A. When detecting that the DC signal 14 becomes in the L level, the microprocessor core 5 reads the data in this case, the 21st instruction IN21) on the data bus 11, and at the next time point of rising of the clock signal 15 (a time point of rising of the clock signal 15 of cycle 9), returns the DS signal 13 to the H level and indicates to the response circuit 4 that the data has been read.

The response circuit 4 returns the DC signal 14 to the H level at the time point of rising of the DS signal 13.

In six cycles from the cycle 3 to the cycle 8, the reading of the 21st instruction IN21 in the address "10001" is completed.

Hereinafter, the microprocessor core 5 outputs the address "100010" in four cycles from the cycle 9 to the cycle 12, and reads the 22nd instruction IN22 in the address "100010" by the same operations in four cycles from the cycle 3 to the cycle 6 in the timing chart of FIG. 10.

As shown in the above-mentioned timing chart of FIG. 10, when reading instructions sequentially from the memory 2 whose access time is 120 ns and the frequency of the clock signal 15 is 20 MHz, the microprocessor 1 according to the first invention of the present invention reads the instruction from the first memory bank 2A (when the least significant bit of the address is "0") in four cycles (200 ns), and reads the instruction from the second bank 2B (when the least significant bit of the address is "1") in two cycles (100 ns).

However, as shown in the timing chart of FIG. 11, when 1 cycle, in which the instruction is not read, exists between an instruction read bus cycle from the second memory bank 2B and an instruction read bus cycle from the first memory bank 2A, the instruction is read from the first memory bank 2A in three cycles (150 ns), and when 2 or more cycles, in which the instruction is not read, exist between the instruction read bus cycle from the second memory bank 2A, the instruction is read from the first memory bank 2A in two cycles (100 ns).

As shown in the timing charts in FIG. 12 and FIG. 13, when reading non-sequential instructions, the microprocessor 1 according to the first invention of the present invention reads both the instructions from the first memory bank 2A and the second memory bank 2B in six cycles (300 ns) respectively.

In the above-mentioned first invention, it is constituted such that, the address counter 6, at the time point of rising of the clock signal 15 when the condition is realized such that, the AS signal 12 is in the L level and the HIT signal 18 is in the H level, fetches and stores the value of the address bus 10B other than the least significant bit 10A of the address bus 10, and at the time point of rising of the clock signal 15 when the condition is realized such that, the least significant bit 10A of the address bus 10 is in the H level, the AS signal 12 is in the L level and the HIT signal 18 is in the L level, outputs the values of the all bit of the stored content to the output bus 16 by adding "1" to its own stored content. However, when it is constituted such that the address counter 6, at the time point of rising of the clock signal 15 when the condition is realized such that, the AS signal 12 is in the L level and the HIT signal 18 is in the H level, fetches and stores the values of the all bit of the address bus 10, and at the time point of rising of the clock signal 15 when the condition is realized such that, the AS signal 12 is in the L level and the HIT signal 18 is in the L level, output the values other than the least significant bit of the stored content to the output bus 16 by adding "1" to its own stored content, the same effect is obtained.

Next, a second invention of the present invention is described.

Figure 14:
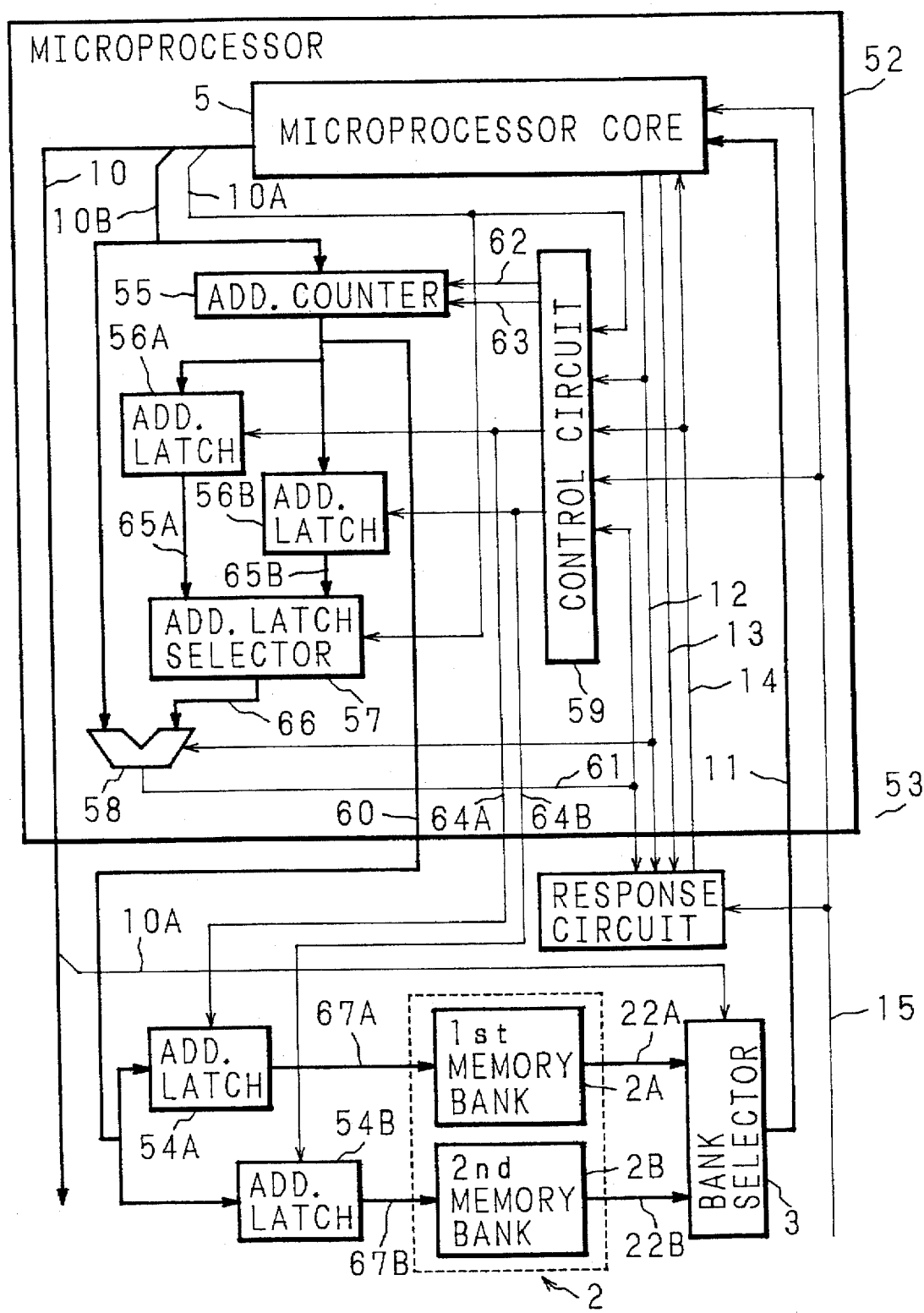
FIG. 14 is a block diagram showing one embodiment of a configuration of a data processor, in which a microprocessor of a second invention of the present invention reads instructions from an external memory.

FIG. 14 is a block diagram showing one embodiment of a configuration of a data processor, in which a microprocessor of the second invention of the present invention reads instructions from an external memory. In addition, in FIG. 14, like reference characters as FIG. 1 referred to in the description of the aforementioned conventional example designate like or corresponding parts.

In FIG. 14, numeral 52 designates the microprocessor of the second invention of the present invention, numeral 53 designates a response circuit, numeral 54A designates an address latch for the first memory bank 2A and numeral 54B designates an address latch for the second memory bank 2B. Numerals 2, 2A, 2B, 3, 22A and 22B designate like elements as the elements of the first invention shown in FIG. 6.

Though address is outputted to the address bus 10 from the microprocessor core 5, the least significant bit 10A thereof is inputted to an control circuit 59 and an address latch selector 57, and the address bus 10B other than the least significant bit 10A is inputted to an address counter 55 and an address comparator 58. The address bus 10 is also outputted to the outside of the microprocessor 52, and the least significant bit 10A is also inputted to the bank selector 3.

The control circuit 59 controls the address counter 55, address latches 56A, 56B, 54A, 54B and address latch selector 57 in response to the least significant bit 10A of the above-mentioned address bus 10 and various signals as to be described later given from the microprocessor core 5 and the response circuit 53.

Different from an address counter which is always included in an usual yon Neumann type microprocessor, the address counter 55 is controlled by the above-mentioned control circuit 59, when a load signal 63 is given, address counter 55 loads and holds the value from the address bus 10B other than the least significant bit 10A and increments the value by "1" and holds it when a count signal 62 is given. The value held by the address counter 55 is outputted to the address latches 56A, 56B and 54A, 54B.

However, such counter can be easily constituted by a usual general counter.

Though an address counter for indicating the instruction address to be processed next is always included in the usual yon Neumann type microprocessor, the above-mentioned address counter 55 is provided separately outside of the microprocessor core 5.

The address latch 56A is for even number and the address latch 56B is for odd number. That is, the address latch 56A latches the even address among the addresses outputted from the address counter 55 by control of the control circuit 59, and the address latch 56B latches the odd address among the addresses outputted from the address counter 55 by control of the control circuit 59.

Numeral 11 designates a data bus, which inputs data outputted from the bank selector 3 to the microprocessor core 5 in the microprocessor 52.

Numeral 12 designates an address strobe signal (hereinafter referred to as the AS signal), which indicates that valid address is outputted to the address bus 10 from the microprocessor core 5. The AS signal 12 is outputted from the microprocessor core 5 and inputted 60 the address comparator 58 and the control circuit 59, and at the same time, also outputted to the outside of the microprocessor 52 and inputted to the response circuit 53.

Numeral 13 designates a data strobe signal (hereinafter, referred to as the DS signal), which indicates that the microprocessor core 5 is reading data from the data bus 11. The DS signal 13 is outputted from the microprocessor core 5 to the outside of the microprocessor 52, and inputted to the response circuit 53.

Numeral 14 designates a data transfer complete signal (hereinafter, referred to as the DC signal), which indicates that valid data is outputted to the data bus 11 from the memory 2. The DC signal 14 is outputted from the response circuit 53 to the inside of the microprocessor 52, and inputted to the microprocessor core 5 as well as to the control circuit 59.

Numeral 15 designates a clock signal, which is inputted to the response circuit 53 as well as to the inside of the microprocessor 52, and inputted to the microprocessor core 5 and the control circuit 59.

The above-mentioned numerals 10 to 15 correspond to the numerals 10 to 15 in the block diagram of FIG. 1 showing the conventional example.

Numeral 60 designates a pre-output address bus, which is outputted from the address counter 55 and inputted to the address latch 56A for even address and to the address latch 56B for odd address, and at the same time, outputted outside of the microprocessor 52 and inputted to the address latch 54A for the first memory bank 2A and to the address latch 54B for the second memory bank 2B.

Numeral 61 designates a pre-output address hit signal (hereinafter, referred to as the HIT signal), which is outputted from the address comparator 58 and inputted to the control circuit 59, and at the same time, outputted also outside of the microprocessor 52 and inputted to the response circuit 53.

Numeral 62 designates a count signal which is outputted from the control circuit 59 and inputted to the address counter 55, and numeral 63 designates a load signal which is outputted from the control circuit 59 and inputted to the address counter 55.

Numeral 64A designates a pre-output address output signal for even address (hereinafter, referred to as the PAA signal), which is outputted from the control circuit 59 and inputted to the address latch 56A for even address, and at the same time, outputted also outside of the microprocessor 52 and inputted to the address latch 54A for the first memory bank 2A.

Numeral 64B designates a pre-output address output signal for odd address (hereinafter, referred to as the PAB signal), which is outputted from the control circuit 59 and inputted to the address latch 56B for odd address, and at the same time, outputted also outside of the microprocessor 52 and inputted to the address latch 54B for the first memory bank 2B.

Numeral 65A designates an output bus of the address latch 56A for even address, which is inputted to the address latch selector 57. Numeral 65B designates an output bus of the address latch 56B for odd address, which is inputted to the address latch selector 57.

Numeral 66 designates an output bus of the address latch selector 57, which is inputted to the address comparator 58.

Numeral 67A designates an output bus, which is outputted from the address latch 54A for the first memory bank 2A of the memory 2 and inputted to the second memory bank 2B, and number 67B designates an output bus, which is outputted from the address latch 54B for the second memory bank 2B and inputted to the second memory bank 2B.

Figure 15:
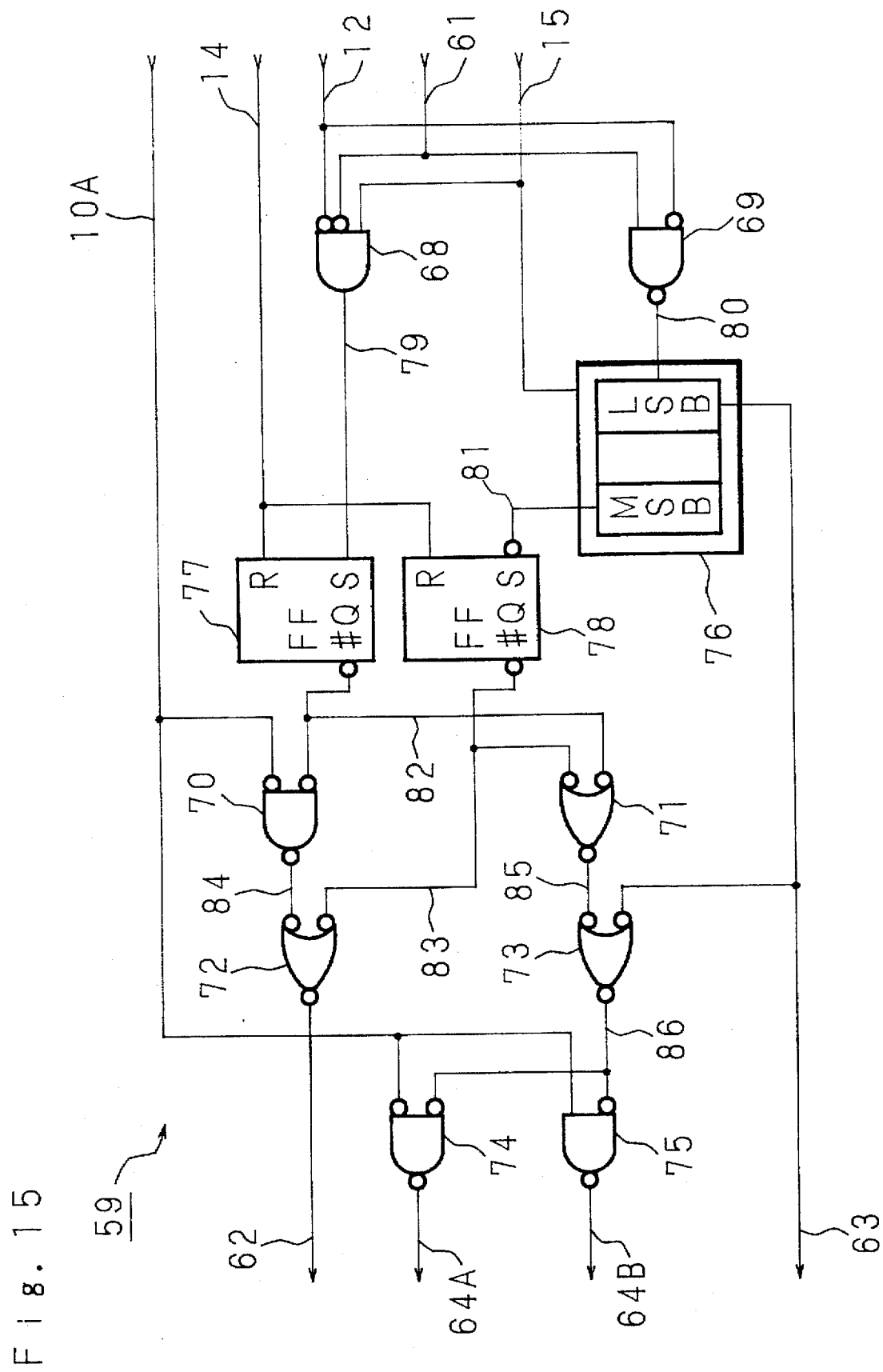
FIG. 15 is a circuit diagram showing a configuration example of a control circuit included in a microprocessor of a second invention of the present invention.

FIG. 15 is a circuit diagram showing an example of configuration of the control circuit 59 included in the microprocessor 52. In FIG. 15, numerals 10A, 12, 14, 15, 61, 62, 63, 64A and 64B designate like constituent elements shown in FIG. 6.

In FIG. 15, numerals 68, 69, 70, 71, 72, 73, 74 and 75 respectively designate logic gates. Numerals 77 and 78 designate flip-flops (hereinafter, referred to as the FF), and numeral 76 designates a clock synchronizing type shift register of 3-bit configuration.

The logic gate 68 inputs the AS signal 12, the HIT signal 61 and the clock signal 15, and outputs an output signal 79.

The logic gate 69 inputs the AS signal 12 and the HIT signal 61, and outputs an output signal 80.

The sift register 76 has a 3-bit configuration in this embodiment. The reason is that, though the sift register 29 operates in synchronism with the clock signal 15 of 20 MHz (a cycle is 50 ns), since the access time of the external memory 2 is 120 ns, a time of 3 clocks (150 ns) is secured for one time of accessing the external memory 2.

The shift register 76 inputs the clock signal 15 as a synchronous signal, and at the same time, inputs the output signal 80 of the logic gate 69 to a first bit (the least significant bit: LSB), outputs the content of the first bit as the load signal 63, and outputs the content of the third bit (the most significant bit: MSB) as an output signal 81.

The FF 77 inputs the DC signal 14 to a reset terminal R and the output signal 79 of the logic gate 68 to a set terminal S, and outputs an output signal 82 from an output terminal #Q (Q represents an inverted signal). The FF 78 inputs the DC signal 14 to the reset terminal R and the output signal 81 of the shift register 786 to the set terminal S, and outputs an output signal 83 from the output terminal #Q.

The logic gate 70 inputs the least significant bit 10A of the address bus 10 and the output signal 82 of the FF 77, and outputs an output signal 84.

The logic gate 71 inputs the output signal 82 of the FF 77 and the output signal 83 of the FF 78, and outputs an output signal 85.

The logic gate 72 inputs the output signal 84 of the logic gate 70 and the output signal 83 of the FF 78, and outputs the count signal 62.

The logic gate 73 inputs the output signal 85 of the logic gate 71 and the load signal 63, and outputs an output signal 86.

The logic gate 74 inputs the least significant bit 10A of the address bus 10 and the output signal 86 of the logic gate 73, and outputs the PAA signal 64A.

The logic gate 75 inputs the least significant bit 10A of the address bus 10 and the output signal 86 of the logic gate 73, and outputs the PAB signal 64B.

Figure 16:
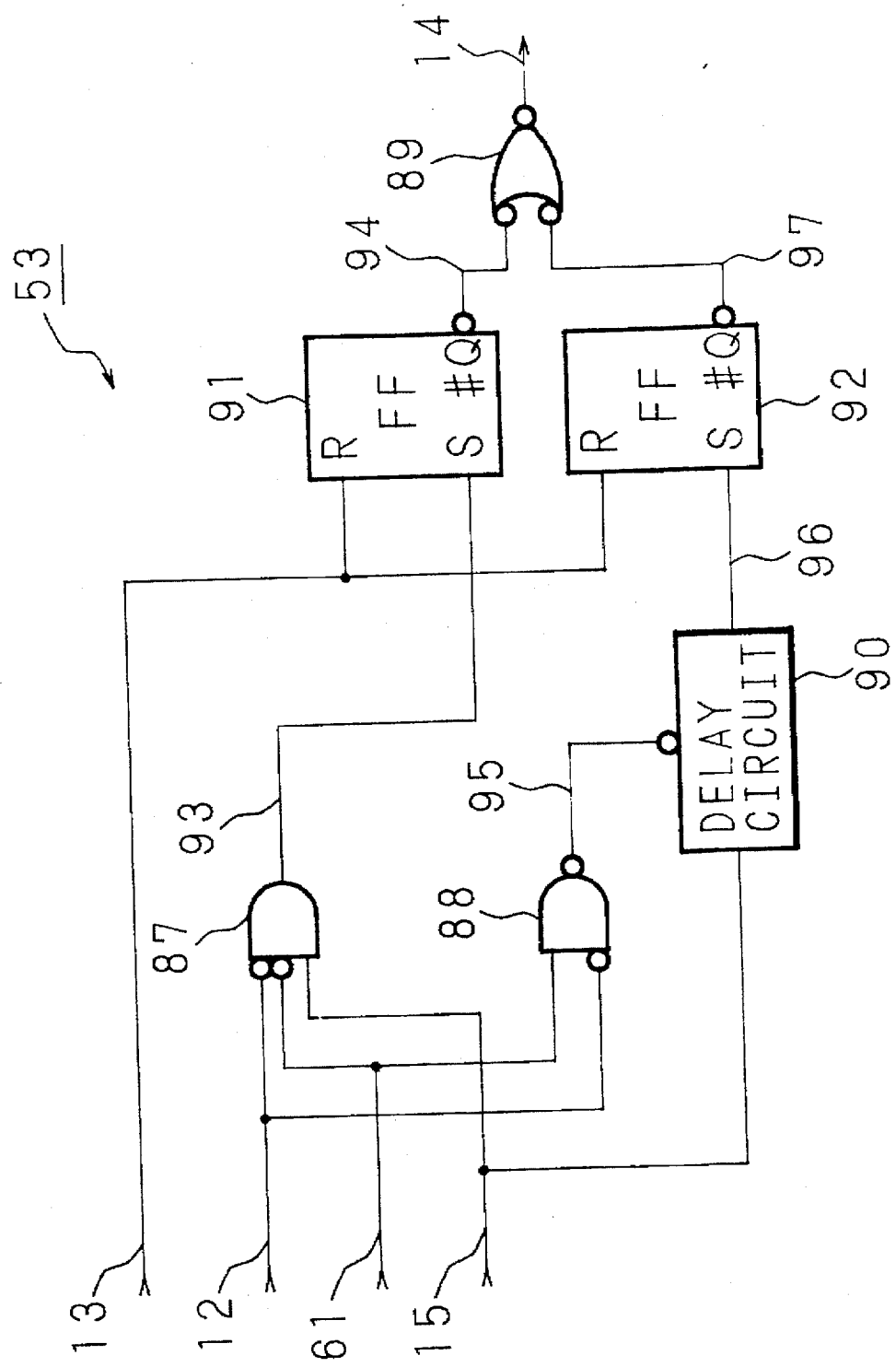
FIG. 16 is a circuit diagram showing a configuration example of a response circuit connected to the outside of a microprocessor of a second invention of the present invention.

FIG. 16 is a circuit diagram showing an example of configuration of the response circuit 53 shown in FIG. 14. In FIG. 16, numerals 12, 13, 14, 15 and 16 designate like constituent elements shown in FIG. 14.

Numerals 87, 88 and 89 designate logic gates, and numeral 90 designates a delay circuit. Numerals 91 and 92 designate flip-flops (hereinafter, referred to as the FF).

The logic gate 87 inputs the AS signal 12, HIT signal 61 and clock signal 15, and outputs an output signal 93.

The FF 91 inputs the output signal 93 of the logic gate 87 to the set terminal S and the DS signal 13 to the reset terminal R, and outputs an output signal 94 from the output terminal #Q.

The logic gate 88 inputs the AS signal 12 and the HIT signal 61, and outputs an output signal 95.

The delay circuit 90 inputs the output signal 95 of the logic gate 88 and the clock signal 15, and outputs an output signal 96.

The FF 92 inputs the output signal 96 of the delay circuit 90 to the set terminal S and the DS signal 13 to the reset terminal $, and output signal 97 from the output terminal #Q.

The logic gate 89 inputs the output signal 94 of the FF 90 and the output signal 97 of the FF 92, and outputs the DC signal 14.

Figure 17:
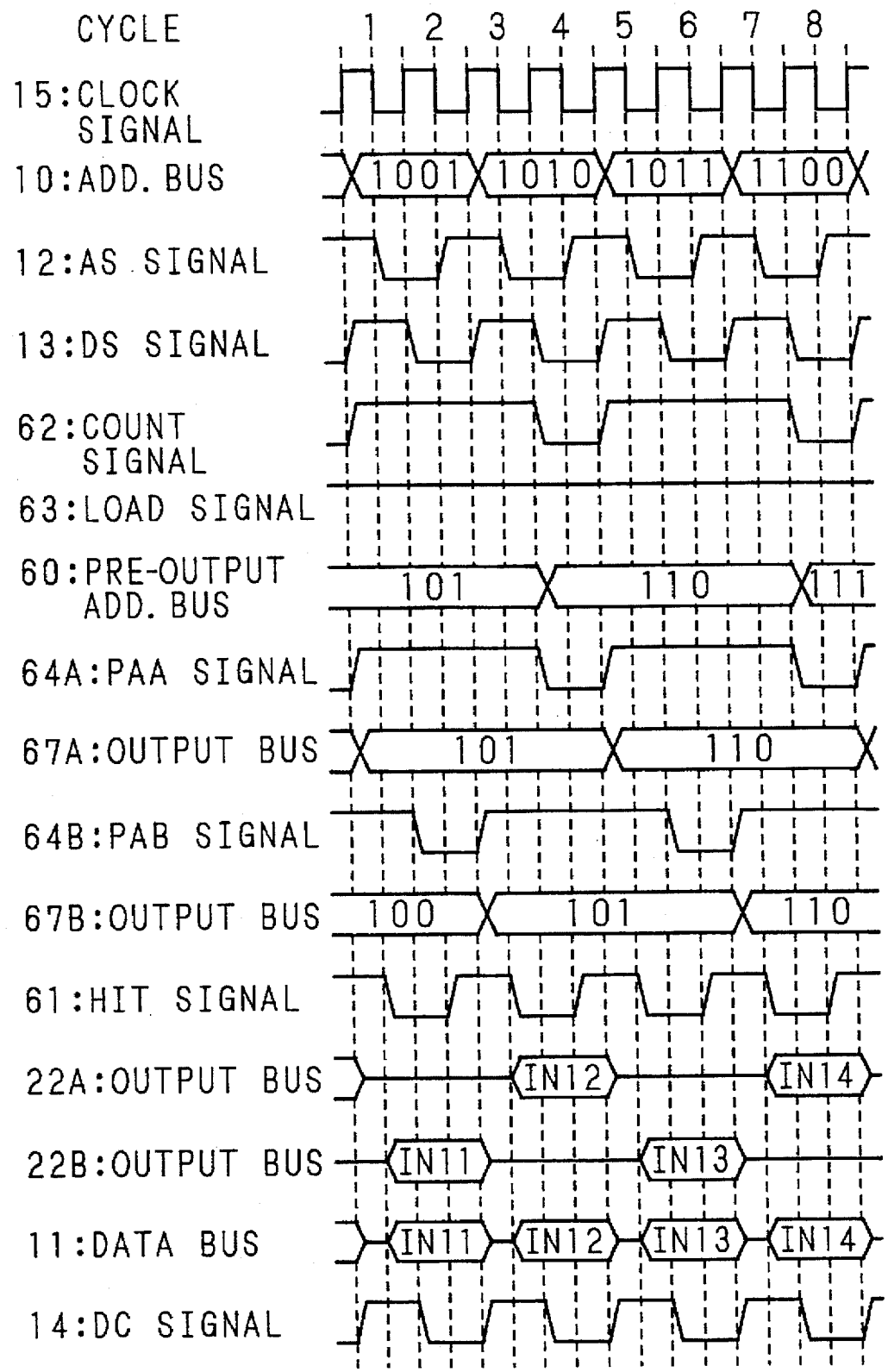
FIG. 17 is a timing chart for explaining an operation example for reading instructions from a memory by a microprocessor of a second invention of the present invention.

FIG. 17 is a timing chart for explaining an example of operation to read instructions from the memory 2 by the microprocessor 52 of the second invention of the present invention.

In this timing chart of FIG. 17, the operation of trading the 11th instruction IN11 in the address "1001", 12th instruction IN12 in the address "1010", 13th instruction IN13 in the address "1011", and 14th instruction IN14 in the address "1100", in order, when the access time of both the memory banks 2A° and 2B of the memory 2 is 120 ns and the frequency of the clock signal 15 is 20 MHz, is shown.

The above-mentioned addresses are those viewed from the microprocessor core 5.

Figure 18:
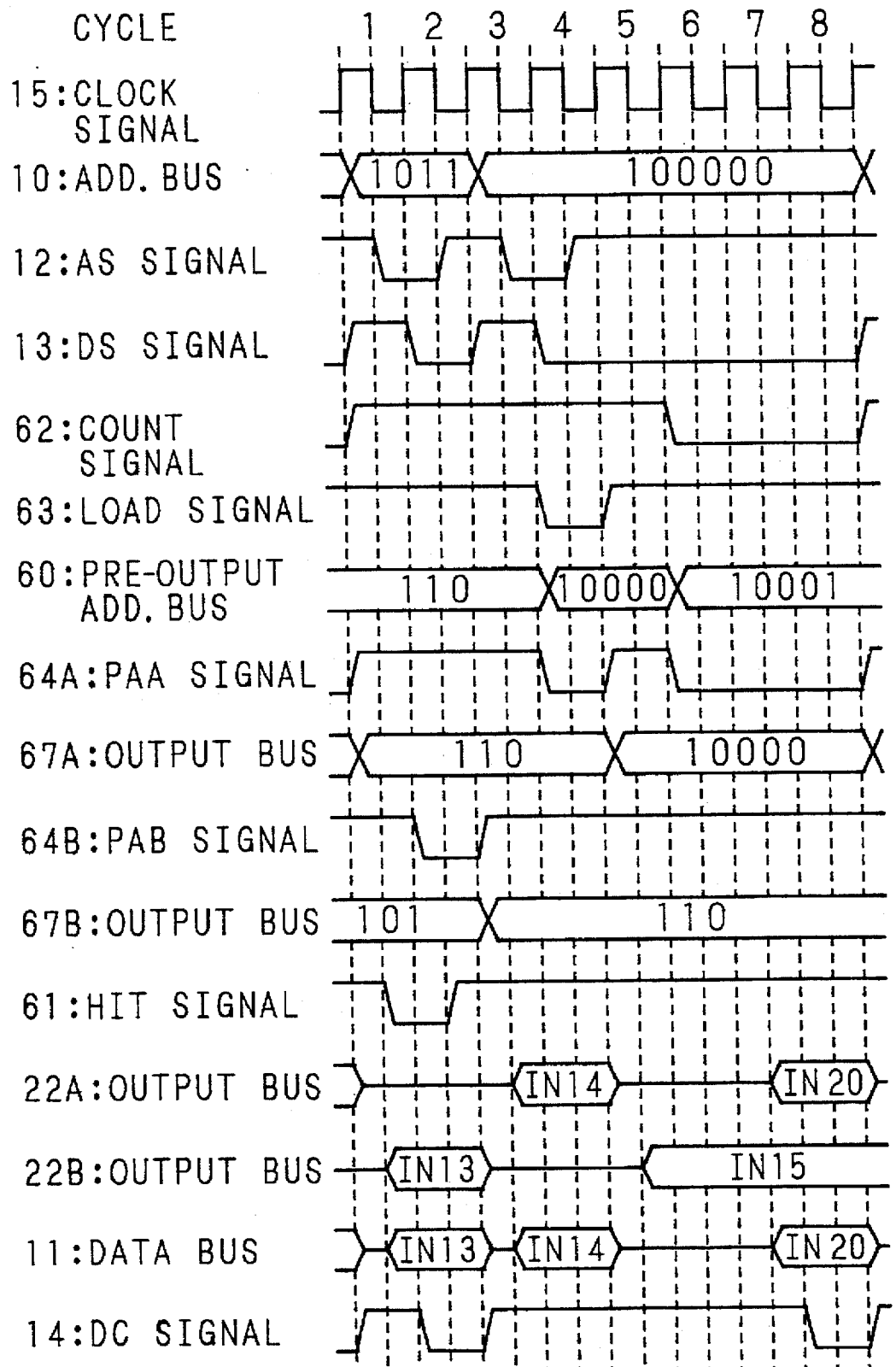
FIG. 18 is a timing chart for explaining another operation example for reading instructions from a memory by a microprocessor of a second invention of the present invention.

FIG. 18 is a timing chart for explaining another example of the operations to read instructions from the memory 2 by the microprocessor 52 of the second invention of the present invention.

In this timing chart of FIG. 18, the operation of reading the 13th instruction IN13 in the address "1011", and 20th instruction IN20 in the address "100000" in order, when the access time of both the memory banks 2A and 2B of the memory 2 is 120 ns and the frequency of the clock signal 15 is 20 MHz, is shown.

The above-mentioned addresses are those viewed from the microprocessor core 5.

Figure 19:
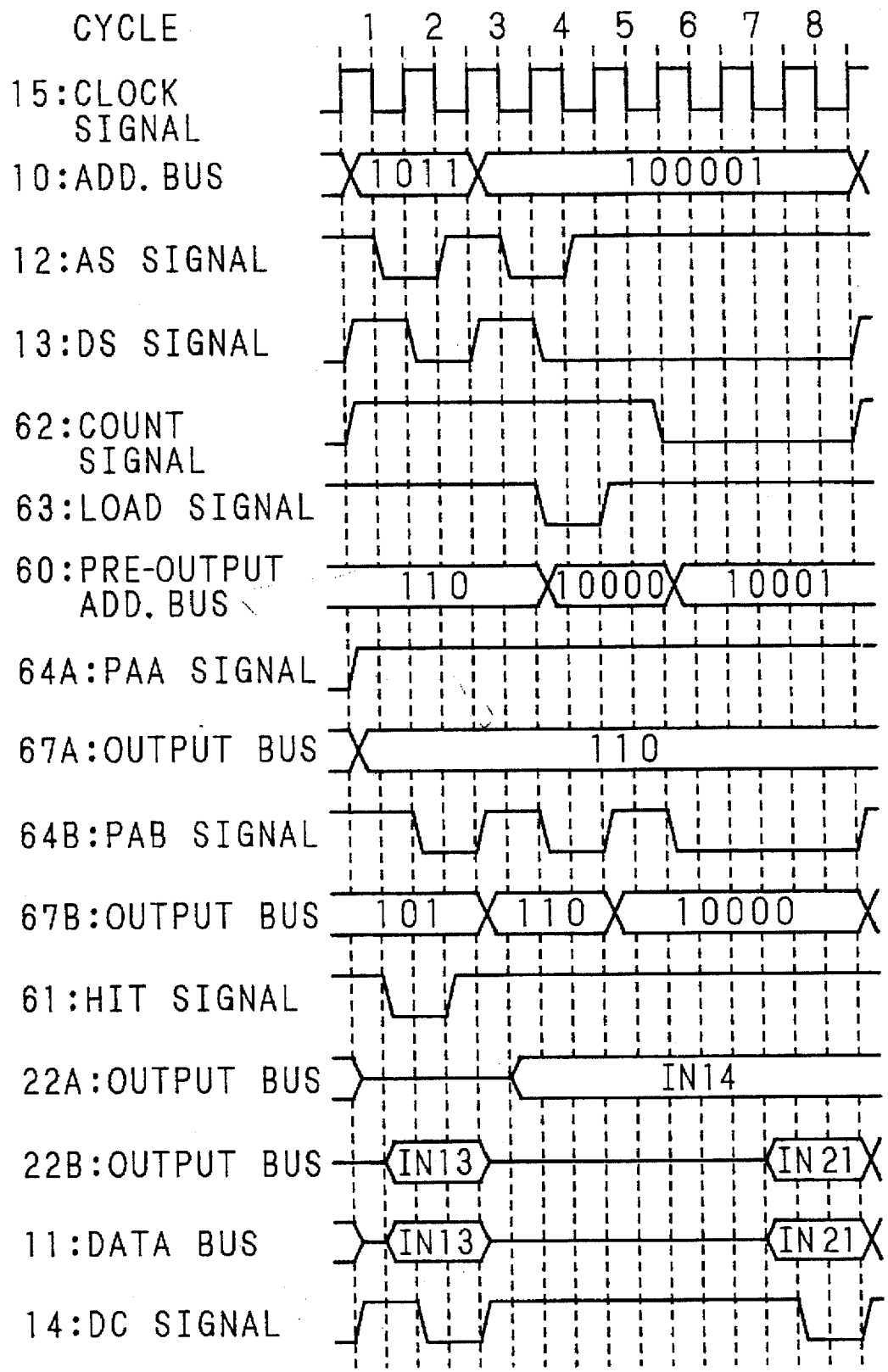
FIG. 19 is a timing chart for explaining still another operation example for reading instructions from a memory by a microprocessor of a second invention of the present invention.

FIG. 19 is a timing chart for explaining still another operation to read instructions from the memory 2 by the microprocessor 52 of the second invention of the present invention.

In this timing chart of FIG. 19, the operation of reading the 13th instruction IN13 in the address "1011", and 21st instruction IN21 in the address "100001" in order, when the access time of both the memory banks 2A and 2B of the memory 2 is 120 ns and the frequency of the clock signal 15 is 20 MHz, is shown.

The above-mentioned addresses are those viewed from the microprocessor core 5.

Arrangement of the inventions in the first memory bank 2A of the memory 2 is, as same as the case of the first invention show in FIG. 9A, such that, the 10th instruction IN10 is to be arranged in the address "100", and 12th instruction IN12 in the address "101", 14th instruction IN14 in the address "110", 20th instruction IN20 in the address "10000" and 22nd instruction IN22 in the address "10001."

Arrangement of the instructions in the second memory bank 2B of the memory 2 is, as same as the case of the first invention show in FIG. 9B, such that, the 11th instruction IN11 is to be arranged in the address "100", and 13th instruction IN13 in the address "101", 15th instruction IN15 in the address "110", 21st instruction IN21 in the address "10000" and 23rd instruction IN23 in the address "10001."

Data (in this case, the instructions) in the addresses, whose least significant bits viewed from the microprocessor core 5 are "0" (even address), are arranged in the addresses of the first memory bank 2A similar to the values other than the least significant bits of the addresses viewed from the microprocessor core 5. Data (in this case, the instructions) in the addresses, whose least significant bits viewed from the microprocessor core 5 are "1" (odd address), are arranged in the addresses of the second memory bank 2B similar to the values other than the least significant bits of the addresses viewed from the microprocessor core 5.

Such an arrangement state of the instructions, when viewed from the microprocessor core 5, becomes equivalent with an example of the instruction arrangement in the external memory 98 of the conventional example shown in FIG. 3.

Next, the operation is described.

In the following description, the HIT signal 61, the count signal 62, the load signal 63, the PAA signal 64A and the PAB signal 64B are all assumed to be negative logics.

At first, the operation of the address counter 55, the address latch 56A for even address, the address latch 56B for odd address, the address latch selector 57, the address comparator 58, the address latch 54A for the first memory bank 2A, the address latch 54B for the second memory bank 2B and the bank selector 3 in the microprocessor 52 of the second invention shown in FIG. 14 is described.

The address counter 55 adds "1" to its own stored content at a time point of falling of the count signal 62, and fetches and stores a value of the address bus 10B other than the least significant bit 10A from the address bus 10 at a time point of falling of the load signal 63. The address counter 55 always outputs its own stored content to the pre-output address bus 60.

The address latch 56A for even address fetches and stores the stored content of the address counter 55 via the address bus 60 at a time point of rising of the PAA signal 64A. The address latch 56A for even address always outputs its own stored content to the output bus 65A.

The address latch 56B for odd address fetches and stores the stored content of the address counter 55 via the address bus 60 at a time point of rising of the PAB signal 64B. The address latch 56B for odd address always outputs its own stored content to the output bus 65B.

The address latch selector 57 outputs a value on the output bus 65A of the address latch 56A for even address to the output bus 66 during the least significant bit 10A of the address bus 10 is in the L level, and outputs a value on the output bus 65B of the address latch 56B for odd address to the output during in the H level.

The address comparator 58 compares the value of the address bus 10B other than the least significant bit 10A of the address bus 10 and the value on the output buss 66 of the address latch selector 57 at the time point of falling of the AS signal 12, and when the comparative result coincides, makes the HIT signal 61 be in the H level. Also, the address comparator 58 makes the HIT signal 61 be in the H level at the time point of rising of the AS signal 12.

The address latch 54A for the first memory bank 2A fetches and stores the value on the pre-output address bus 60 at the time point of rising of the PAA signal 64A. The address latch 54A for the first memory bank 2A always outputs its own stored content to the output bus 67A of the address latch 54A for the first memory bank 2A.

The address latch 54B for the second memory bank 2B fetches and stores the value on the pre-output address bus 60 at the time point of rising of the PAB signal 64B. The address latch 54B for second memory always outputs its own stored content to the output bus 67B of the address latch 54B for the first memory bank 2B.

The address latch 56A for even address and the address latch 54A for the first memory bank 2A always store the same value. Also, the address latch 56B for odd address and the address latch 54B for the second memory bank 2B always store the same value.

The bank selector 3 outputs data on the output bus 22A of the first memory bank 2A to the data bus 11 during the least significant bit 10A of the address bus 10 is in the L level, and outputs data on the output bus 22B of the second memory bank 2B to the data bus 11 during in the H level.

Next, the operation of the control circuit 59 in the microprocessor 52 of the second invention of the present invention shown in FIG. 14 is described with reference to FIG. 15.

The logic gate 68 makes the output signal 79 be in the H level when the condition is realized such that, the AS signal 12 is in the L level, HIT signal 61 is in the L level and clock signal 15 is in the H level, and makes the output signal 79 be in the L level when the above-mentioned condition is not realized.

The logic gate 69 makes the output signal 80 be in the L level when the condition is realized such that, the AS signal 12 is in the L level and the HIT signal 61 is in the H level, and makes the output signal 80 be in the H level when the above-mentioned condition is not realized.

Contents of 3 bits in the shift register 76 are all in the H level at an initial state. At every rising of the clock signal 15, the shirt register 76 dumps the content of the third bits, shifts the content of the second bit to the third bits, shifts the content of the first bit to the second bit and fetches a value of the output signal 80 of the logic gate 69 into the first bit. The shift register 76 always outputs the content of the first bit as the load signal 63, and always outputs the content of the third bit as the output signal 81.

Thus, the load signal 63 changes tot he L level from the H level at a time point of rising of the clock signal 15 first from the case where the output signal 80 of the logic gate 69 is in the L level, and the output signal 81 changes to the L level from the H level at a third point of rising of the clock signal 15.

When the output signal 80 of the logic gate 69 returns to the H level in such a manner, at the time point of the first rising of the clock signal 15 from a time point at which the output signal 80 of the logic gate 69 returns to the H level, the load signal 63 returns to the H level from the L level, and at the third time point of rising of the clock signal 15, the output signal 81 returns to the H level from the L level.

The FF 77 is set at the time point of rising of the output signal 79 of the logic gate 68 to make the output signal 82 be in the L level, and is reset at the time point of rising of the DC signal 14 to return the output signal 82 to the H level.

The FF 78 is set at a time point of falling of the output signal 81 of the shift register 76 to make the output signal 83 be in the L level, and is reset at the time point of rising of the DC signal 14 to return the output signal 83 to the H level.

The logic gate 70 makes the output signal 84 be in the L level when the condition is realized such that, the least significant bit 10A of the address bus 10 is in the L level and the output signal 82 of the FF 77 is in the L level, and makes the output signal 84 be in the H level when the above-mentioned condition is not realized.

The logic gate 71 makes the output signal 85 be in the L level when the condition is realized such that, the output signal 82 of the FF 77 is in the L level, or the output signal 83 of the FF 78 is in the L level, and makes the output signal 85 be in the H level when the above-mentioned condition is not realized.

The logic gate 72 makes the count signal 62 be in the L level when the condition is realized such that, the output signal 84 of the logic gate 70 is in the L level or the output signal 83 of the FF 78 is in the L level, and makes the count signal 62 be in the H level when the above-mentioned condition is not realized.

The logic gate 73 makes the output signal 86 be in the L level when the condition is realized such that, the output signal 83 of the logic gate 71 is in the L level or the load signal 63 is in the L level, and makes the output signal 86 be in the H level when the above-mentioned condition is not realized.

The logic gate 74 makes the PAA signal 64A be in the L level when the condition is realized such that, the output signal 86 of the logic gate 73 is in the L level and the least significant bit 10A of the address bus 10 is in the L level, and makes the PAA signal 64A be in the H level when the above-mentioned condition is not realized.

The logic gate 75 makes the PAB signal 64B be in the L level when the condition is realized such that, the output signal 86 of the logic gate 73 is in the L level and the least significant bit 10A of the address bus 10 is in the L level, and makes the PAB signal 64B be in the H level when the above-mentioned condition is not realized.

Thus, a time point at which the count signal 62 changes to the L level from the H level is the following two time points. One is the time point of rising of the clock signal 15 when the condition is realized such that, the least significant bit 10A of the address bus 10 is in the L level, the AS signal 12 is in the L level and the HIT signal 61 is in the L level. The other is the third time point of rising of the clock signal 15 counted from and including the time point of rising of the clock signal 15 when the condition is realized such that, AS signal 12 is in the L level and the HIT signal 61 is in the H level. The count signal 62 returns to the H level from the L level at the time point of rising of the DC signal 14.

A time point at which the load signal 63 changes to the L level from the H level is the time point of rising of the clock signal 15 when the condition is realized such that, the AS signal 12 is in the L level and the HIT signal 61 is in the H level. The load signal 63 returns to the H level from the L level at the next time point of rising of the clock signal 15.

The PAA signal 64A changes to the L level from the H level at the time point of rising of the clock signal 15 when the condition is realized such that, the least significant bit of 10A of the address bus 10 is in the L level, the AS signal 12 is in the L level and the HIT signal 61 is in the L level, and returns to the H level from the L level at the next time point of rising of the DC signal 14. The PAA signal 64A changes to the L level from the H level at the time point of rising of the clock signal 15 when the condition is realized such that, the least significant bit 10A of the address bus 10 is in the L level, the AS signal 12 is in the L level and the HIT signal 61 is in the H level, returns to the H level from the L level at the next time point of rising of the clock signal 15, changes to the L level from the H level at the further next time point of rising of the clock signal 15, and returns to the H level from the L level at the next time point of rising of the DC signal 14.

The PAB signal 64B changes to the L level from the H level at the time point of rising of the clock signal 15 when the condition is realized such that, the least significant bit 10A of the address bus 10 is in the H level, the AS signal 12 is in the L level and the HIT signal 61 is in the L level, and returns to the H level from the L level at the next time point of rising of the DC signal 14. The PAB signal 64B changes to the L level from the H level at the time point of rising of the clock signal 15 when the condition is realized such that, the least significant bit 10A of the address bus 10 is in the H level, the AS signal 12 is in the L level and the HIT signal 61 is in the H level, returns to the H level from the L level at the next time point of rising of the clock signal 15, changes to the L level from the H level at the further next time point of rising of the clock signal 15, and returns to the H level from the L level at the next time point of rising of the DC signal 14.

Next, the operation of the response circuit 53 shown in FIG. 14 is described with reference to FIG. 16.

The logic gate 87 makes the output signal 93 be in the H level when the condition is realized such that, the AS signal 12 is in the L level, the HIT signal 61 is in the L level and the clock signal 15 is in the H level, and makes the output signal 93 be in the L level when the above-mentioned condition is not realized.

When the output signal 93 of the logic gate 87 becomes in the H level, the FF 91 is set to make the output signal 94 be in the L level, and is reset at the time point of rising of the DS signal 13 to return the output signal 94 to the H level.

The logic gate 88 makes the output signal 95 be in the L level when the condition is realized such that, the AS signal 12 is in the L level and the HIT signal 61 is in the H level, and makes the output signal 95 be in the H level when the above-mentioned condition is not realized.

The delay circuit 90 starts to count the number of times of rising of the clock signal 15 when the output signal 95 of the logic gate 88 becomes in the L level, makes the output signal 96 be in the H level at the time point of rising of the clock signal 15 when a count number becomes "5", and at the next time point of rising of the clock signal 15, returns it to the L level.

The FF 92 is set when the output signal 96 of the delay circuit 90 becomes in the H level to make the output signal 97 be in the L level, and is reset at the time point of rising of the DS signal 13 to return the output signal 97 to the H level.

The logic gate 89 makes the DC signal 14 be in the L level when the condition is realized such that, the output signal 94 of the FF 91 is in the L level or the output signal 97 of the FF 92 is in the L level, and makes the DC signal 14 be in the H level when the above-mentioned condition is not realized.

Thus, a time point at which the DC signal 14 changes to the L level from the H level is following two time points. One is the time point of rising of the clock signal 15 when the condition is realized such that, the AS signal 12 is in the L level and the HIT signal 61 is in the L level. The other is the fifth time point of rising of the clock signal 15 counted from and including the time point of rising of the clock signal 15 when the condition is realized such that, the AS signal 12 is in the L level and the HIT signal 61 is in the H level. The DC signal 14 returns to the H level from the L level at the time point of rising of the DS signal 13.

A configuration of the response circuit 53 is dependent on the access time of the memory 2 and the frequency of the clock signal 15, and the above-mentioned configuration is an example of configuration when the access time of the memory 2 is 120 ns and the frequency of the clock signal 15 is 20 MHz.

In the following, the operation of the microprocessor 52 of the second invention of the present invention shown in the timing charts of FIG. 17, FIG. 18 and FIG. 19 is described.

For convenience of sake of the description, the microprocessor core 5 is to read one instruction in one bus cycle, and as shown in FIG. 17, FIG. 18 and FIG. 19, respective cycles of the clock signal 15 are numbered.

In the following description, a rising of the clock signal 15 of cycle n is defined as a transition point to the H level of the clock signal 15 of cycle n from the L level of the clock signal 15 of cycle n-1, in other words, the rising.

FIG. 17 is a timing chart for explaining an example of operation to read instructions from the memory 2 by the microprocessor 52 of the second invention of the present invention.

In the timing chart of FIG. 17, the operation of reading sequential instructions, specifically, the operation of reading an 11th instruction IN11 in an address "1001", a 12th instruction IN12 in an address "1010", a 13th instruction IN13 in an address "1011" and a 14th instruction IN14 in an address "1100", when the access time (a time till valid data is outputted after assertion of the address) of both the memory banks 2A and 2B of the memory 2 is 120 ns and the frequency of the clock signal 15 is 20 MHz (a cycle is 50 ns) is shown.

The above-mentioned addresses are those viewed from the microprocessor core 5.

The 11th instruction IN11 in the address "1001" is read from the cycle 1.

Assume that, the content of the address counter 55 and the value of the pre-output address bus 60 both becomes "101" by the operation before the cycle 1, and the load signal 63, the PAB signal 64B and the HIT signal 61 are in the H level.

Also, assume that, by the operation before the cycle 1, the contents of the address latch 56B for odd address and the address latch 54B for the second memory bank 2B become "100", which is outputted to the output bus 67B, and the second memory bank 2B is being accessed.

Furthermore, assume that, by the operation before the cycle 1, the count signal 62 and the PAA signal 64A change to the H level from the L level at the time point of rising of the clock signal; 15 of cycle 1, and the value "101" of the pre-output address bus 60 is fetched and stored in the address latch 56A for even address and the address latch 54A for the first memory bank 2A.

At first, at the time point of rising of the clock signal 15 of cycle 1, the address "1001" is outputted to the address bus 10 from the microprocessor core 5. Thus, the least significant bit 10A of the address bus 10 becomes in the H level, and the address bus 10B other than the least significant bit 10A of the address bus 10 becomes "100".

Since the least significant bit 10A of the address bus 10 becomes in the H level, the bank selector 3 outputs data on the output bus 22B of the second memory bank 2B to the data bus 11. However, since valid data is still not outputted to the output bus 22B of the second memory bank 2B, the valid data is not outputted to the data bus 11.

Since the least significant bit 10A of the address bus 10 becomes in the H level, the address latch selector 57 outputs the content "100" of the address latch 56B for odd address to the output bus 66 via the output bus 65B.

At a time point of falling of the clock signal 15 of cycle 1, the microprocessor core 5 makes the AS signal 12 be in the L level, and indicates to the control circuit 59 and response circuit 53 that valid address has been outputted. As the AS signal 12 becomes in the L level, the address comparator 58 compares the value "100" of the address bus 10B other than the least significant bit 10A of the address bus 10 and the value "100" on the output bus 66 of the address latch selector 57. Since they coincide with each other in this case, the address comparator 58 makes the HIT signal 61 be in the L level.

During the clock signal 15 of cycle 1 is in the L level, the valid data (in this case, the 11th instruction IN11) is outputted to the output bus 22B from the second memory bank 2B, and by the bank selector 3, the valid data (in this case, the 11th instruction IN11) is outputted to the data bus 11. A time point, at which the valid data (in this case, the 11th instruction IN 11) is outputted to the output buss 22B from the second memory bank 2B, is after 120 ns from a time point at which the address latch 54B for the second memory bank 2B have fetched and stored the value "100" by the operation before the cycle 1.

At the time point of rising of the clock signal 15 of cycle 2, the microprocessor core 5 makes the DS signal 13 be in the L level and indicates to the response circuit 53 that data is being read. Since the rising of the clock signal 15 of cycle 2 corresponds to the rising of the clock signal 15 when the aforementioned condition is realized such that, the least significant bit 10A of the address bus 10 is in the H level, the AS signal 12 is in the L level and the HIT signal 61 is in the L level, the control circuit 59 makes the PAB signal 64B be in the L level.

At the time point of falling of the clock signal 15 of cycle 2, the microprocessor core 5 returns the AS signal 12 to the H level, and the address comparator 58 returns the HIT signal 61 to the H level.

Since the rising of the clock signal 15 of cycle 2 is the rising of the clock signal 15 when the aforementioned condition is realized such that, the AS signal 12 is in the L level and the HIT signal 61 is in the L level, the response circuit 53 makes the DC signal 14 be in the L level and indicates that the valid data (in this case, the 11th instruction IN11) is outputted to the data bus 11. When detecting that the DC signal 14 becomes in the L level, the microprocessor core 5 reads the data (in this case, the 11th instruction IN11) on the data bus 11, and at the next time point of rising of the clock signal 15 of cycle 3), returns the DS signal 13 to the H level and indicates to the response circuit 53 that the data has been read.

At the time point of rising of the DS signal 13, the response circuit 53 returns the DC signal 14 to the H level.

At the time point of rising of the DC signal 14, the control circuit 59 returns the PAB signal 64B to the H level. Since the PAB signal 64B changes to the H level from the L level, the address latch 56B for odd address and the address latch 54B for the second memory bank 2B fetch and store the value "101" of the pre-output address bus 60.

In the above two cycles from the cycle 1 to the cycle 2, the reading of the 11th instruction IN11 in the address "1001" is completed.

Next, the 12th instruction in the address "1010" is rad from the cycle 3.

At a time point of rising of the clock signal 15 of cycle 3, the address "1010" is outputted to the address bus 10 from the microprocessor core 5. Thus, the least significant bit 10A of the address bus 10 becomes in the L level and the address bus 10B other than the least significant bit 10A of the address bus 10 becomes "101".

Since the least significant bit 10A of the address bus 10 becomes in the L level, the bank selector 3 outputs the data on the output bus 22A of the first memory bank 2A to the data bus 11. However, since 120 ns has not passed from the time point at which the address latch 54A for the first memory bank 2A fetches and stores the value "101", a valid data is still not outputted to the output buss 22A of the first memory bank 2A, thus the valid data is not outputted to the data bus 11.

Since the least significant bit 10A of the address bus 10 becomes in the L level, the address latch selector 57 outputs the content "101" of the address latch 56A for even address to the output bus 66 via the output bus 65A.

At the time point of falling of the clock signal 15 of cycle 3, the microprocessor core 5 makes the AS signal 12 be in the L level and indicates to the control circuit 59 and the response circuit 53 that the valid address has been outputted. since the AS signal 12 becomes int eh L level, the address comparator 58 compares the value "101" of the address bus 10B other than the least significant bit 10A of the address bus 10 and the value "101" on the output bus 66 of the address latch selector 57. Since they coincide with each other in this case, the address comparator 58 makes the HIT signal 61 be in the L level.

During the clock signal 15 of cycle 3 is in the L level, valid data (in this case, the 12th instruction IN12) is outputted to the output bus 22A from the first memory bank 2A, and by the bank selector 3, the valid data (in this case, the 12th instruction IN12) is outputted to the output bus 22A from the first memory bank 2A is after 120 ns from the time point at which the address latch 56A for even address and the address latch 54A for the first memory bank 2A fetch and store the value "101" at the time point of rising of the clock signal 15 of cycle 1.

At a time point of rising of the clock signal 15 of cycle 4, the microprocessor core 5 makes the DS signal 13 be in the L level and indicates to the response circuit 53 that data is being read.

Since a rising of the clock signal 15 of cycle 4 corresponds to the rising of the clock signal 15 when the condition is realized such that, the least significant bit 10A of the address bus 10 is in the L level, the AS signal 12 is in the L level and the HIT signal 61 is in the L level, the control circuit 59 makes the count signal 62 and the PAA signal 64A be in the L level. Since the count signal 62 changes to the L level from the H level, the address counter 55 adds "1" to the stored content "101" to make it "110". Thus, the value of the pre-output address bus 60 becomes "110".

At a time point of falling of the clock signal 15 of cycle 4, the microprocessor core 5 returns the AS signal 12 to the H level, and the address comparator 58 returns the HIT signal 61 to the H level.

Since the rising of the clock signal 15 of cycle 4 corresponds to the rising of the clock signal 15 when the aforementioned condition is realized such that, the AS signal 12 is in the L level and the HIT signal 61 is in the L level, the response circuit 53 makes the DC signal 14 be in the L level and indicates to the microprocessor core 5 that the valid data (in this case, the 12th instruction IN12) is outputted to the data bus 11.

When detecting that the DC signal 14 is in the L level, the microprocessor core 5 reads the data in this case, the 12th instruction IN12) on the data bus 11, and at the next time point of rising of the clock signal 15 (a time point of rising of the clock signal 15 of cycle 5), returns the DS signal 13 to the H level and indicates to the response circuit 53 that the data has been read.

(97)

At the time point of rising of the DS signal 13, the response circuit 53 returns the DC signal 14 to the H level.

The control circuit 59 returns the count signal 62 and PAA signal 64A to the H level at the time point of rising of the DC signal 14. Since the PAA signal 64A changes to the H level from the L level, the address latch 56A for the first memory bank 2A fetch and store the value "110" of the pre-output address bus 60.

In two cycles from the cycle 3 to the cycle 4, the reading of the 12th instruction IN12 in the address "1010" is completed.

Hereinafter, the microprocessor core 5 outputs the address "1011" in two cycles from the cycle 5 to the cycle 6 to read the 13th instruction IN13 in the address "1011" by the same operation as in the cycles from the cycle 1 to the cycle 2, and in the two cycles from the cycle 7 to the cycle 8, outputs the address "1100" to read the 14th instruction in the address "1100" by the same operation as in the two cycles from the cycle 3 to the cycle 4.

Next, referring to a timing chart of FIG. 18, the operation of reading non-sequential instructions from the memory 2 by the microprocessor 52, specifically, the operation of reading the 13th instruction IN13 in the address "1011" and the 20th instruction IN20 in the address "100000" in order, when the access time of the first memory bank 2A and second memory bank 2B is 120 ns and the frequency of the clock signal 15 is 20 MHz is described.

The above mentioned addresses are those viewed from the microprocessor core 5.

In two cycles from the cycle 1 to the cycle 2, the microprocessor 52 reads the 13th instruction IN13 in the address "1011" by the same operations as in the type cycles from the cycle 5 to the cycle 6 of FIG. 17.

At the time point of rising of the clock signal 15 of cycle 3, the address "100000" is outputted to the address bus 10 from the microprocessor core 5. Thus, the lest significant bit 10A of the address bus 10 becomes in the L level, and the address bus 10B other than the least significant bit 10A of the address bus 10 becomes "10000."

Since the least significant bit 10A of the address bus 10 becomes in the L level, the bank selector 3 outputs data on the output bus 22A of the first memory bank 2A to the data bus 11. However, since valid data is still not outputted to the output bus 22A of the first memory bank 2A, the valid data is not outputted to the data bus 11.

Since the least significant bit 10A of the address bus 10A becomes in the L level, the address latch selector 57 outputs the content "110" of the address latch 56A for even address to the output bus 66 via the output bus 65A.

At the time point of rising of the clock signal 15 of cycle 3, the microprocessor core 5 makes the AS signal 12 be in the L level and indicates to the control circuit 59 and response circuit 53 that valid address has been outputted. Since the AS signal 12 becomes in the L level, the address comparator 58 compares the value "10000" of the address bus 10B other than the least significant bit 10A of the address bus 10 and the value "110" on the output bus 66 of the address latch selector 57. Since they do not coincide with teach other in this case, the address comparator 58 keeps the HIT signal 61 in the H level without change.

During the clock signal 15 of cycle 3 is in the L level, data (in this case, the 14th instruction IN14) is outputted to the output bus 22A from the first memory bank 2A, and by the bank selector 3, the data (in this case, the 14th instruction IN14) is outputted to the data bus 11. A time point, at which the data (in this case, the 14th instruction IN14) is outputted to the output bus 22A from the first memory bank 2A, is after 20 ns from a time point at which the address latch 56A for even address and the address latch 54A for the first memory bank 2A fetch and store the value "110" by the operation before the cycle 1 (the time point of rising of the clock signal 15 of cycle 1). However, the above-mentioned data (in this case, the 14th instruction IN14) is not the 20th instruction IN20 which is to read by the microprocessor 52 from the cycle 3, but invalid data.

At a time point of rising of the clock signal 15 of cycle 4, the microprocessor core 5 makes the DS signal 13 be in the L level and indicates to the response circuit 52 that data is being read. The microprocessor core 5 returns the AS signal 12 to the H level at a time point of falling of the clock signal 15 of cycle 4.

Since the rising of the clock signal 15 of cycle 4 corresponds to the rising of the clock signal 15 when the aforementioned condition is realized such that, the AS signal 12 is in the L level and the HIT signal 61 is in the H level, the control circuit 59 makes the load signal 63 be in the L level, and returns it to the H level at a time point of rising of the clock signal 15 of cycle 5.

Also, since the rising of the clock signal 15 of cycle 4 corresponds to the rising of the clock signal 15 when the condition is realized such that, the least significant bit 10A of the address bus 10 is in the L level, the AS signal 12 is in the L level and the HIT signal 61 is in the H level, the control circuit 59 makes the PAA signal 64A be in the L level, returns it to the H level at the time point of rising of the clock signal 15 of cycle 5, and makes it be in the L level at a time point of rising of the clock signal 15 of cycle 6.

Since the rising of the clock signal 15 of cycle 6 corresponds to a third time point of rising of the clock signal 15 counted from and including the time point of rising of the clock signal 15 when the aforementioned condition is realized such that, the AS signal 12 is in the L level and the HIT signal 61 is in the H level, the control circuit 59 makes the count signal 62 be in the L level. Since the load signal 63 changes to the L level from the H level at the time point of rising of the clock signal 15 of cycle 4, the address counter 55 fetches and stores the value "10000" of the address bus 10B other than the least significant bit 10A of the address bus 10.

Thus, the value of the pre-output address bus 60 becomes "10000."

Since the PAA signal 64A changes to the H level from the L level at the time point of rising of the clock signal 15 of cycle 5, the address latch 56A for even address and the address latch 54A for the first memory bank 2A fetch and store the value "10000" of the pre-output address bus 60.

Since the count signal 62 changes to the L level from the H level at the time point of rising of the clock signal 15 of cycle 6, the address counter 55 adds "1" to the stored content "10000" and makes it "10001". Thus, the value of the pre-output address bus 60 becomes "10001."

During the clock signal 15 of cycle 7 is in the L level, valid data (in this case, the 20th instruction IN20) is outputted to the output bus 22A from the first memory bank 2A, and by the bank selector 3, the valid data (in this case, the 20th instruction IN20) is outputted to the data bus 11. A time point at which the valid data (in this case, the 20th instruction IN20) is outputted to the output bus 22A from the first memory bank 2A is after 120 ns from the time point at which the address latch 56A for even address and the address latch 54A for the first memory bank 2A fetch and store the value "10000" at the time point of rising of the clock signal 15 of cycle 5.

Since a rising of the clock signal 15 of cycle 8 corresponds to a fifth time point of rising of the clock signal 15 from and including the time point of rising of the clock signal 15 when the condition is realized such that, the AS signal 12 is in the L level and the HIT signal 61 is in the H level, the response circuit 53 makes the DC signal 14 be in the L level, and indicates that the valid data (in this case, the 20th instruction IN20) is outputted to the data bus 11. When detecting that the DC signal 14 becomes in the L level, the microprocessor core 5 reads data on the data bus 11 (in this case, the 20th instruction IN20), returns the DS signal 13 to the H level at the next time point of rising of the clock signal 15 (a time point of rising of the clock signal 15 of cycle 9), and indicates that the data has been read.

At the time point of rising of the DS signal 13, the response circuit 53 returns the DC signal 14 to the H level.

The control circuit 59 returns the count signal 62 and the PAA signal 64A to the H level at the time point of rising of the DC signal 14. Since the PAA signal 64A changes to the H level from the L level, the address latch 56A for even address and the address latch 54A for the first memory bank 2A fetch and store the value "10001" of the pre-output address bus 60.

In the above six cycles from the cycle 3 to the cycle 8, the reading of the 20th instruction IN20 in the address "100000" is completed.

Next, referring to a timing chart of FIG. 19, the operation of reading non-sequential instructions, specifically, the operation of reading the 14th instruction IN13 in the address "1011" and the 21st instruction IN21 in the address "100001" in order from the memory 2, by the microprocessor 52, when the access time of the first memory bank 2A and second memory bank 2B is 120 ns and the frequency of the clock signal 15 is 20 MHz, is described.

The above-mentioned addresses are those viewed from the microprocessor core 5.

In two cycles from the cycle 1 to the cycle 2, the microprocessor 52 reads the 13th instruction IN13 in the address "1011" by the same operation as in the two cycles from the cycle 5 to the cycle 6 of FIG. 17.

At the time point of rising of the clock signal 15 of cycle 3, the address "100001" is outputted to the address bus 10 from the microprocessor core 5. Thus, the least significant bit 10A of the address bus 10 becomes in the H level, and the address bus 10B other than the least significant bit 10A of the address bus 10 becomes "10000."

Since the last significant bit 10A of the address bus 10 becomes in the H level, the bank selector 3 outputs data on the output bus 22B of the second memory bank 2B to the data bus 11. However, since valid data is still not outputted to the output bus 22B of the second memory bank 2B, the valid data is not outputted to the data bus 11. Since the least significant bit 10A of the address bus 10 becomes in the H level, the address latch selector 57 outputs the content "110" of the address latch 56B for odd address to the output bus 66 via the output bus 65B.

At a time point of falling of the clock signal 15 of cycle 3, the microprocessor core 5 makes the AS signal 12 be in the L level and indicates to the control circuit 59 and the response circuit 53 that valid address has been outputted. Since the AS signal 12 becomes in the L level, the address comparator 58 compares the value "100000" of the address bus 10B other than the least "110" on the output bus 66 of the address latch selector 57. Since they do not coincide with each other in this case, the address comparator 58 keeps the HIT signal 61 in the H level without change.

At the time point of rising of the clock signal 15 of cycle 4, the microprocessor core 5 makes the DS signal 13 be in the L level and indicates to the response circuit 53 that data is being read. The microprocessor core 5 returns the AS signal 12 to the H level at the time point of falling the clock signal 15 cycle 4.

Since the rising of the clock signal 15 cycle 4 corresponds to the rising of the clock signal 15 when the aforementioned condition is realized such that, the AS signal 12 is in the L level and the HIT signal 61 is in the H level, the control circuit 59 makes the load signal 63 be in the L level, and returns it to the H level at the time point of rising of the clock signal 15 of cycle 5. Since the rising of the clock signal 15 of cycle 4 corresponds to the rising of the clock signal 15 when the aforementioned condition is realized such that, the least significant bit 10A of the address bus 10 is in the H level, the AS signal 12 is in the L level and the HIT signal 61 is in the H level, the control circuit 59 makes the PAB signal 64B be in the L level, returns it to the H level at the time point of rising the clock signal 15 of cycle 5, and makes it be in the L level at the time point of rising of the clock signal 15 of cycle 6. Since the rising of the clock signal 15 of cycle 6 corresponds to a third time point of rising of the clock signal 15 counted from and including the time point of rising of the clock signal 15 when the aforementioned condition is realized such that, the AS signal 12 is in the L level and the HIT signal 61 is in the H level, the control circuit 59 makes the count signal 62 in the L level.

Since the load signal 53 changes to the L level from the H level at the time point of rising of the clock signal of cycle 4, the address counter 55 fetches and stores the value "10000" of the address bus 10B other than the least significant bit 10A of the address bus 10. Thus, the value of the address bus 60 becomes "100000".

Since the PAB signal 64B changes to the H level from the L level at the time point of rising of the clock signal 15 of cycle 5, the address latch 56B for odd address and the address latch 54B for the second memory bank 2B fetch and store the value "10000" of the pre-output address bus 60.

Since the count signal 62 changes to the L level from the H level at the time point of rising the clock signal 15 of cycle 6, the address counter 55 adds "1" to the stored content "100000" and the makes it "100001". Thus, the value of the pre-output address bus 60 becomes "10001". Since the value of the address latch 54B for the second memory bank 2B becomes "110" (during the clock signal 15 of cycle 5 is in the L level), data (in the case, the 15th instruction IN15) is not outputted to the data bus 11.

During the clock signal 15 of cycle 7 is in the L level, valid data (in this case, the 21st instruction IN21) is outputted to the output bus 22B from the second memory bank 2B, and by the bank selector 3, the valid data (in this case, the 21st instruction IN21) is outputted to the data bus 11. A time point at which the valid data (in this case, the 21st instruction IN21) is outputted to the output bus 22B from the second memory bank 2B is after 120 ns from a time point at which the address latch 56B for odd address and the address latch 54B for the second memory bank 2B fetch and store the value "10000" at the time point of rising of the clock signal 15 of cycle 5.

Since a rising of the clock signal 16 of cycle 8 corresponds to a fifth time point of rising of the clock signal 15 counted from and including the time point of rising of the clock signal 15 when the aforementioned conditioned is realized such that, the AS signal is in the L level and the HIT signal 61 is in the H level, the response circuit 53 makes the DC signal 14 be in the L level, and indicates to the microprocessor core 5 that the valid data (in this case, the 21st instruction In21) is outputted to the data bus 11.

When detecting that the DC signal 14 becomes in the L level, the microprocessor core 5 reads the data (in this case, the 21st instruction IN21) on the data bus 11, returns the DS signal 13 to the H level at the next time point of rising of the clock signal 15 (a time point of rising of the clock signal 15 of cycle 9), and indicates to the response circuit 53 that data has been read.

At the time point of rising of the DS signal 13, the response circuit 53 returns the DC signal 14 to the H level. PAB signal 64B to the H level at the time point of rising of the DC signal 14. Since the PAB signal 64B changes to the H level from the L level, the address latch 56B for odd address and the address latch 54B for the second memory bank 2B fetch and store the value "100001" of the pre-output address bus 60.

In the above six cycles from the cycle 3 to the cycle 8, the reading of the 21st instruction IN21 in the address "100001" is completed.

As shown in the timing chart of FIG. 17, when the microprocessor 52 of the second invention of the present invention reads the instructions sequentially from the memory 2 whose access time is 120 ns and the frequency of the clock signal 15 is 20 MHz, both the instruction read from the first memory bank 2A (when the least significant bit of the address is "0"), and the instruction read from the second memory bank 2B (when the least significant bit of the address is "1") are performed in two cycle (100 ns) respectively.

Also, as shown in FIG. 18 and FIG. 19, when the microprocessor 52 of the second invention of the present invention reads non-sequential instructions, both the instruction read form the first memory bank 2A and the instruction read from the second memory bank 2B are performed in six cycles (300 ns) respectively.

As particularly described heretofore, according to the first invention, when a microprocessor core performs sequential memory access, since an address value can be given to a second memory bank beforehand during accessing a first memory bank, the time required for accessing t he second memory bank can be shortened, and since the address value can also be given to the first memory bank beforehand when accessing to the first memory bank following accessing to the second memory bank is not performed sequentially, the time required for accessing the first memory bank can also be shortened.

When the memory access is not performed sequentially and an address value given to the first and second memory banks beforehand differs from a value excluding a least significant bit from an actual address, the value excluding the least significant bit from the actual address is given to the first and second memory banks after being latched by an address counter and an address latch for proper access. Particularly, since the instruction read operation of the microprocessor core is performed sequentially except the case, where the executable instruction sequence changes due to execution of the branch instructions or occurrence of interruptions, even when a memory which is inexpensive but has a relatively long access time is used as memory storing the instructions, the access time can be shortened and the execution speed of an entire system can be improved.

According to the second invention, when the microprocessor core executes the sequential memory access, since an address value can be given to the second memory bank beforehand during accessing the first memory bank, and the address value can be given to the first memory bank beforehand during accessing the second memory bank, the time required for accessing the first and second memory banks can be shortened.

Also, when the memory access is not performed sequentially and an address value given to the first and second memory banks beforehand differs form a value excluding a least significant bit from an actual address, the value excluding the least significant bit from an actual address, the value excluding the least significant bit from the actual address is given to the first and second memory banks after being latched by an address counter for proper access. Particularly, since the instruction read operation of the microprocessor core is performed sequentially except the case, where the executable instruction sequence changes due the execution of the branch instructions or occurrence of interruptions, even when a memory which is inexpensive but has a relatively long access time is used as the memory storing the instructions, even when a memory which is inexpensive but has a relatively long access time is used as the memory storing the instructions, the access time can be shortened and the execution speed of an entire system can be improved.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within the meets and bounds of the claims, or equivalence of such meets and bounds thereof are therefore intended to be embraced by the claims.

What is claimed is:

1. A microprocessor for accessing a first area of a memory external to said microprocessor and a second area of the memory by outputting common addresses excluding a least significant bit of the actual addresses, said first area of the memory storing data for even addresses and the second area of the memory storing data for odd addresses, said microprocessor comprising:

a microprocessor core for generating the actual addresses;

an address counter for generating a pre-output address value obtained by, at a start of every access to the second area of the memory, sequentially incrementing from an initial value obtained by excluding the least significant bit from the actual address generated by said microprocessor core;

an address latch for latching the pre-output address value generated by said address counter, and outputting the pre-output address value outside the microprocessor to the memory;

a control circuit for controlling the address latch to latch the pre-output address value generated by the address counter and to provide the pre-output address value to the memory after accessing the memory; and an address comparator for, at the time of accessing the first and second areas of the memory, comparing the value obtained by excluding the least significant bit from the actual address generated by said microprocessing core and the pre-output address value latched by the address latch, and outputting a hit signal when both values coincide with each other, the control circuit controlling the address counter and the address latch to latch the value obtained by excluding the least significant bit from the actual address generated by said microprocessing core when the address comparator does not output a hit signal when accessing the first and second areas of the memory.

2. A microprocessor for accessing a first area of a memory external to said microprocessor and a second area of the memory by outputting common addresses excluding a least significant bit of the actual addresses, said first area of the memory storing data for even addresses and the second area of the memory storing data for odd addresses, said microprocessor comprising:

a microprocessor core for generating the actual addresses;

an address counter for generating a pre-output address value obtained by, at a start of every access to the memory, sequentially incrementing from an initial value obtained by excluding the least significant bit from the actual address generated by said microprocessor core, and outputting the pre-output address value to said memory;

a first address latch for latching the pre-output address value generated by said address counter;

a second address latch for latching the pre-output address value generated by said address counter;

a control circuit for controlling the first address latch to latch the pre-output address value generated by said address counter at every completion of accessing said first area, and the second address latch to latch the pre-output address value generated by said address counter at every completion of accessing said second area;

an address latch selector for selecting the pre-output address value latched by said first latch when the actual address value output by said microprocessor core is even, and selecting the pre-output address value latched by said second latch when the actual address value output by said microprocessor core is odd; and an address comparator for, at the time of accessing the first and second areas of the memory, comparing the value obtained by excluding the least significant bit from the actual address generated by said microprocessor core and the pre-output address value outputted by the address latch selector, and output a hit signal when both values coincide with each other, the control circuit controlling the address counter to latch the value obtained by excluding the least significant bit from the actual address generated by said microprocessor core when the address comparator does not output a hit signal when accessing the first and second areas of the memory.

3. A data processor, comprising:

a memory having a first area storing data of even addresses and a second area storing data of odd addresses;

a bank selector for selecting an output from said first area when a least significant bit value of an actual address is "0", and an output from said second area when the least significant bit value of the actual address is "1", a microprocessor having a microprocessor core for generating the actual address, and outputting an address valid signal when a valid actual address is output, an address counter for generating a value as a pre-output address value obtained by, at a start of every access to said memory, sequentially incrementing the value from an initial value obtained by excluding the least significant bit from the actual address generated by said microprocessor core, an address latch for latching the pre-output address value generated by said address counter, and outputting the pre-output address value to said memory, said memory being external to said microprocessor, a control circuit controlling said address latch to latch the pre-output address value generated by said address counter and to provide the pre-output address value to said memory after accessing said second area of the memory, and outputting a pre-output address output signal indicating that the pre-output address value is output, and an address comparator for comparing the value obtained by excluding the least significant bit from the actual address generated by said microprocessing core and the pre-output address value latched by said address latch when accessing said first and second areas, and outputting a hit signal when both values coincide with each other; and a response circuit for outputting a data valid signal indicating that an output from said bank selector is valid during a time when the pre-output address by said control circuit and the hit signal from said address comparator are output when said microprocessor core outputs the address valid signal, wherein said microprocessor core reads the output from said bank selector when said response circuit is outputting the data valid signal, and said control circuit controls said address counter and said address latch to latch the value obtained by excluding the least significant bit from the actual address generated by said microprocessing core when said address comparator is not outputting the hit signal when accessing said first and second areas of the memory.

4. A data processor, comprising:

a memory having a first area storing data of even addresses and a second area storing data of odd addresses;

a bank selector for selecting an output from said first area when a least significant bit value of an actual address is "0", and an output from said second area when the least significant bit value of the actual address is "1";

a microprocessor having a microprocessor core for generating the actual address, and outputting an address valid signal when a valid actual address is output, an address counter for generating a value as a pre-output address value obtained by, at a start of every access to said memory, sequentially incrementing the value from an initial value obtained by excluding the least significant bit from the actual address generated by said microprocessor core, and outputting the pre-output address value to said memory, the memory being external to said microprocessor, a first address latch for latching the pre-output address value generated by said address counter, a second address latch for latching the pre-output address value generated by said address counter, a control circuit for controlling said first address latch to latch the pre-output address value generated by said address counter and output a first pre-output address output signal at every completion of an accessing said first area of the memory, and for controlling the second address latch to latch the pre-output address value generated by said address counter and output a second pre-output address output signal at every completion of accessing said second area of the memory, an address latch selector for selecting the pre-output address value latched by said first latch when the actual address value output by said microprocessor core is even, and selecting the pre-output address value latched by said second latch when the actual address value output by said microprocessor core is odd, and an address comparator for comparing the value excluding the least significant bit of the actual address output by said microprocessor core and the pre-output address value output by said address latch selector when accessing said first and second areas, and outputting a hit signal when both values coincide;

a response circuit for outputting a valid data signal indicating that an output from said bank selector is valid when said address comparator either outputs or does not output the hit signal during outputting of the address valid signal by said microprocessor core;

a third address latch for latching the pre-output address value generated by said address counter and providing the pre-output address value to said first area of the memory during outputting of the first pre-output address output signal by said control circuit; and a fourth address latch for latching the pre-output address value generated by said address counter and providing the pre-output address value to said second area during outputting of the second pre-output address output signal by said control circuit, wherein said microprocessor core reads the output from said bank selector when said response circuit is outputting the data valid signal, and said control circuit controls said address counter to latch the value obtained by excluding the least significant bit from the actual address output by said microprocessor core when said address comparator is not outputting the hit signal when accessing said first and second areas of the memory.

* * * * *